(12) United States Patent
Huang et al.

(10) Patent No.: US 11,943,989 B2
(45) Date of Patent: Mar. 26, 2024

(54) DISPLAY MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaoxia Huang, Beijing (CN); Bing Ji, Beijing (CN); Shuang Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 666 days.

(21) Appl. No.: 16/977,642

(22) PCT Filed: Nov. 1, 2019

(86) PCT No.: PCT/CN2019/115063
§ 371 (c)(1),
(2) Date: Sep. 2, 2020

(87) PCT Pub. No.: WO2021/081988
PCT Pub. Date: May 6, 2021

(65) Prior Publication Data
US 2022/0384530 A1 Dec. 1, 2022

(51) Int. Cl.
H10K 59/40 (2023.01)
H05K 1/18 (2006.01)
(Continued)

(52) U.S. Cl.
CPC ............. *H10K 59/40* (2023.02); *H05K 1/189* (2013.01); *H10K 50/868* (2023.02); *H10K 59/131* (2023.02); *H05K 2201/10128* (2013.01)

(58) Field of Classification Search
CPC ............................ G06F 1/1643; G06F 3/0488
See application file for complete search history.

(56) References Cited

U.S. PATENT DOCUMENTS

| 10,833,131 B2 | 11/2020 | Lin et al. |
| 2015/0187845 A1 | 7/2015 | Kim |
| | | (Continued) |

FOREIGN PATENT DOCUMENTS

| CN | 108803164 A | 11/2018 |
| CN | 109032416 A | 12/2018 |
| | (Continued) | |

OTHER PUBLICATIONS

Extended European Search Report dated Oct. 11, 2022 received in European Patent Application No. EP 19949544.1.

*Primary Examiner* — Fred Tzeng
(74) *Attorney, Agent, or Firm* — Scully, Scott, Murphy & Presser, P.C.

(57) ABSTRACT

A display module and a display device are disclosed. The display module includes a first flexible circuit board, a display substrate, and a touch sensor disposed on the display side of the display substrate. The display substrate includes a flat region and curved surface regions; the touch sensor includes first and second bonding regions; the first bonding region and the second bonding region are on a surface, away from the display substrate, of the touch sensor, stacked with the flat region and spaced apart from each other; the first flexible circuit board is electrically connected with the touch sensor through the first bonding region and the second bonding region; the first flexible circuit board includes a (Continued)

main body and first and second bonding connection portions; the first and second bonding connection portions are respectively bonded with the first and second bonding regions.

17 Claims, 22 Drawing Sheets

(51) Int. Cl.
*H10K 50/80* (2023.01)
*H10K 59/131* (2023.01)

(56) References Cited

U.S. PATENT DOCUMENTS

| | | | |
|---|---|---|---|
| 2016/0147345 A1 | 5/2016 | Lee et al. | |
| 2016/0307973 A1* | 10/2016 | Yang | G06F 1/1643 |
| 2018/0004330 A1 | 1/2018 | Kim | |
| 2018/0182829 A1* | 6/2018 | Shin | G06F 1/1652 |
| 2019/0058150 A1* | 2/2019 | Lee | H10K 50/87 |
| 2019/0102027 A1 | 4/2019 | Yoo | |
| 2019/0259965 A1* | 8/2019 | Jeon | H10K 77/111 |
| 2019/0305053 A1 | 10/2019 | Lin et al. | |
| 2019/0343010 A1* | 11/2019 | Ji | H05K 5/0086 |
| 2020/0057545 A1* | 2/2020 | Seomoon | G06F 3/0488 |
| 2020/0125205 A1* | 4/2020 | Ahn | G06F 1/1637 |
| 2020/0203672 A1* | 6/2020 | Kuon | G06F 1/1652 |
| 2020/0274104 A1* | 8/2020 | Park | H10K 50/844 |
| 2020/0274105 A1* | 8/2020 | Han | H10K 59/12 |
| 2020/0404797 A1* | 12/2020 | Kim | H05K 5/0217 |
| 2022/0149313 A1* | 5/2022 | Nakamura | G02F 1/1335 |
| 2022/0278303 A1* | 9/2022 | Han | H10K 59/40 |

FOREIGN PATENT DOCUMENTS

| | | |
|---|---|---|
| CN | 109032426 A | 12/2018 |
| CN | 208225024 U | 12/2018 |
| CN | 109542270 A | 3/2019 |
| CN | 109917959 A | 6/2019 |
| CN | 110277435 A | 9/2019 |

* cited by examiner

DISPLAY MODULE AND DISPLAY DEVICE

CROSS-REFERENCE TO RELATED APPLICATIONS

This application is a national phase entry of PCT International Application No. PCT/CN2019/115063, filed on Nov. 1, 2019. The disclosure of PCT International Application No. PCT/CN2019/115063 is incorporated by reference herein.

TECHNICAL FIELD

Embodiments of the present disclosure relate to a display module and a display device.

BACKGROUND

Organic light emitting diode (OLED) display devices have characteristics of wide viewing angle, high contrast and fast response speed. Moreover, as compared with inorganic light emitting display devices, organic light emitting diode display devices have advantages of higher luminous brightness and lower drive voltage. Because of the above characteristics and advantages, organic light emitting diode (OLED) display devices gradually attract people's extensive attention and can be applied in mobile phones, displays, notebook computers, digital cameras, instruments, and other devices with a display function.

SUMMARY

At least one embodiment of the present disclosure provides a display module, which comprises: a first flexible circuit board, a display substrate, and a touch sensor on a display side of the display substrate. The display substrate comprises a flat region and curved surface regions respectively on two sides of the flat region in a first direction; the touch sensor comprises a first bonding region and a second bonding region on a first side of a second direction intersecting with the first direction; the first bonding region and the second bonding region are on a surface, away from the display substrate, of the touch sensor, and the first bonding region and the second bonding region are stacked with the flat region and are spaced apart from each other; the first flexible circuit board is electrically connected with the touch sensor through the first bonding region and the second bonding region; the first flexible circuit board comprises a main body, and a first bonding connection portion and a second bonding connection portion which protrude from the main body and are spaced apart from each other; and the first bonding connection portion is bonded with the first bonding region so as to be electrically connected with the first bonding region, and the second bonding connection portion is bonded with the second bonding region so as to be electrically connected with the second bonding region.

For example, in at least one example of the display module, the first bonding connection portion and the second bonding connection portion of the first flexible circuit board are bent, and the main body of the first flexible circuit board is on a side, away from the touch sensor, of the display substrate.

For example, in at least one example of the display module, the display module further comprises: a drive chip on the side, away from the touch sensor, of the display substrate. The drive chip is configured to drive the display substrate; an orthographic projection of the drive chip on the flat region of the display substrate is in a region surrounded by an orthographic projection of the first bonding connection portion of the first flexible circuit board on the flat region of the display substrate, an orthographic projection of the second bonding connection portion of the first flexible circuit board on the flat region of the display substrate and an orthographic projection of the main body of the first flexible circuit board on the flat region of the display substrate; and the orthographic projection of the drive chip on the flat region of the display substrate is spaced apart from the orthographic projection of the first bonding connection portion of the first flexible circuit board on the flat region of the display substrate, the orthographic projection of the second bonding connection portion of the first flexible circuit board on the flat region of the display substrate and the orthographic projection of the main body of the first flexible circuit board on the flat region of the display substrate.

For example, in at least one example of the display module, the display substrate further comprises: a substrate main body and a fold portion protruding from the substrate main body on the first side; the substrate main body comprises the flat region and the curved surface regions; and the fold portion is provided on a side, away from the touch sensor, of the substrate main body by bending.

For example, in at least one example of the display module, the drive chip is on a side, away from the touch sensor, of the fold portion, and the drive chip is bonded onto the fold portion.

For example, in at least one example of the display module, the display module further comprises a second flexible circuit board; the second flexible circuit board is on a side, away from the substrate main body, of the fold portion and is bonded with the fold portion; and the drive chip is on a side, away from the fold portion, of the second flexible circuit board.

For example, in at least one example of the display module, the display module further comprises a third flexible circuit board. The third flexible circuit board is on the side, away from the touch sensor, of the display substrate; the first flexible circuit board and the third flexible circuit board are bonded so as to allow the first flexible circuit board and the third flexible circuit board to be electrically connected with each other; and the third flexible circuit board and the second flexible circuit board are bonded so as to allow the third flexible circuit board and the second flexible circuit board to be electrically connected with each other, or the third flexible circuit board and the drive chip are bonded so as to allow the third flexible circuit board and the drive chip to be electrically connected with each other.

For example, in at least one example of the display module, the display module further comprises a fourth flexible circuit board. The fourth flexible circuit board comprises a third bonding connection portion; the display substrate further comprises a third bonding region in the flat region; the third bonding region partially overlaps with an orthographic projection of the first bonding region on the flat region of the display substrate and an orthographic projection of the second bonding region on the flat region of the display substrate, or the third bonding region is between an orthographic projection of the first bonding region on the flat region of the display substrate and an orthographic projection of the second bonding region on the flat region of the display substrate; and the fourth flexible circuit board is bonded and electrically connected with the display substrate through the third bonding connection portion and the third bonding region.

For example, in at least one example of the display module, the fourth flexible circuit board further comprises a main body connected with the third bonding connection portion; and the third bonding connection portion of the fourth flexible circuit board is bent, and the main body of the fourth flexible circuit board is on the side, away from the touch sensor, of the display substrate.

For example, in at least one example of the display module, the fourth flexible circuit board further comprises the drive chip, and the drive chip is on a side, away from the touch sensor, of the main body of the fourth flexible circuit board.

For example, in at least one example of the display module, the display module further comprises a third flexible circuit board. The third flexible circuit board is on the side, away from the touch sensor, of the display substrate; the first flexible circuit board and the third flexible circuit board are bonded, so as to allow the first flexible circuit board and the third flexible circuit board to be electrically connected with each other; and the third flexible circuit board and the fourth flexible circuit board are bonded, so as to allow the third flexible circuit board and the fourth flexible circuit board to be electrically connected with each other.

For example, in at least one example of the display module, the main body of the first flexible circuit board is on a side, away from the display substrate, of the third flexible circuit board; the first flexible circuit board further comprises an electrical connection region protruding from the main body, and the electrical connection region of the first flexible circuit board is on a side, away from the first bonding connection portion and the second bonding connection portion, of the main body of the first flexible circuit board; the electrical connection region of the first flexible circuit board at least partially overlaps with the third flexible circuit board in a direction perpendicular to the display substrate; and the first flexible circuit board is bonded with the third flexible circuit board through the electrical connection region so as to be electrically connected with third flexible circuit board.

For example, in at least one example of the display module, the display module further comprises a bonding support structure and a cover plate. The bonding support structure is respectively stacked with the first bonding connection portion and the second bonding connection portion in a direction perpendicular to the flat region of the display substrate; the bonding support structure is on a side of a portion, which is in contact with the touch sensor, of the first bonding connection portion of the first flexible circuit board away from the touch sensor; the cover plate is on the display side of the display substrate, and is on a side, away from the display substrate, of the touch sensor; and the bonding support structure is sandwiched between the first flexible circuit board and the cover plate.

For example, in at least one example of the display module, the bonding support structure is a foam layer or a polyethylene terephthalate layer.

For example, in at least one example of the display module, the display module further comprises a polarizer. The polarizer is between the touch sensor and the cover plate; a sum of a thicknesses of the bonding support structure and a thicknesses the first bonding connection portion in a direction perpendicular to the flat region of the display substrate is substantially equal to a distance between the touch sensor and the cover plate in the direction perpendicular to the flat region of the display substrate.

For example, in at least one example of the display module, the display module further comprises an adhesive layer. The adhesive layer is between the cover plate and the polarizer; and the sum of the thicknesses of the bonding support structure and the thicknesses of the first bonding connection portion in the direction perpendicular to the flat region of the display substrate is substantially equal to a sum of a thicknesses of the polarizer and a thicknesses of the adhesive layer in the direction perpendicular to the flat region of the display substrate.

At least one embodiment of the present disclosure further provides a display device, which comprises any one of the display modules provided by at least one embodiment of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various under-screen texture recognition function components. Similarly, the terms "a", "a" or "the" etc. are not intended to indicate a quantitative limit, but indicate the existence of at least one. The terms "comprise," "comprising," "include," "including," etc., are intended to specify that the components or the objects stated before these terms encompass the components or the objects and equivalents thereof listed after these terms, but do not preclude the other components or objects. The phrases "connect" or "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

Figure 1:
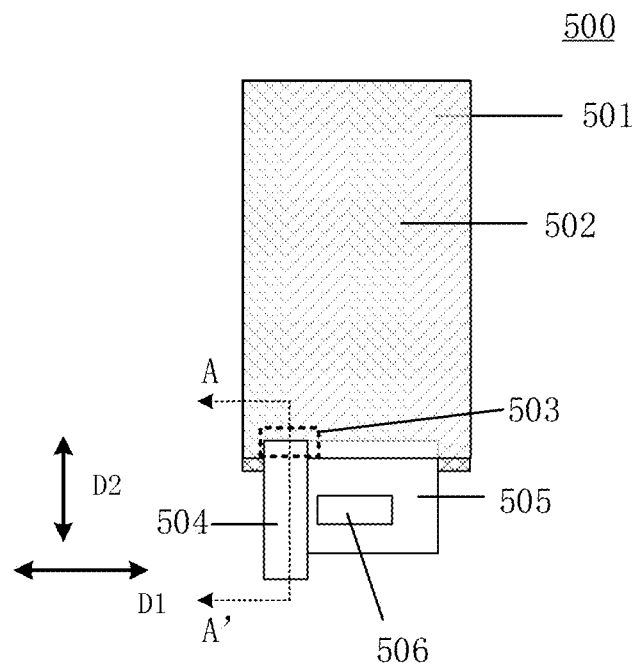
FIG. 1 is a front view of a display module.

FIG. 1 is a front view of a display module (i.e., a schematic plan view obtained through observing the display module from the front of the display module). For example, the display module may be an active matrix organic light emitting diode display screen, and the display screen is a non-curved screen. As illustrated in FIG. 1, the display module comprises a display substrate 501 (for example, an organic light emitting diode display panel) and a touch sensor 502 disposed at the display side of the display substrate 501. As illustrated in FIG. 1, the display module further comprises a first flexible circuit board 504 (i.e., a circuit board for the touch sensor) and a fourth flexible circuit board 505 (e.g., chip on film). It should be noted that both of the first flexible circuit board 504 and the fourth flexible circuit board 505 of the display module as illustrated in FIG. 1 are not in a bending state.

Figure 2A:
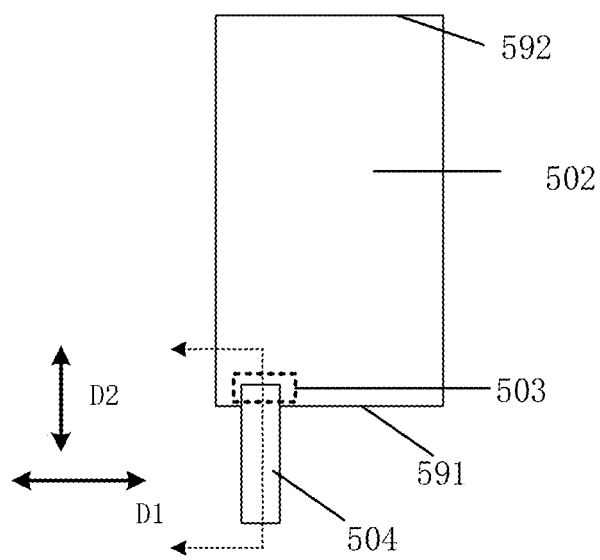
FIG. 2A is a front view of a touch sensor and a first flexible circuit board of the display module as illustrated in FIG. 1.

FIG. 2A is a front view of the touch sensor 502 and the first flexible circuit board 504 of the display module as illustrated in FIG. 1. It should be noted that the first flexible circuit board 504 as illustrated in FIG. 2A is not in a bending state. As illustrated in FIG. 2A, the touch sensor 502 has a first side 591 and a second side 592 in the second direction D2, the touch sensor 502 comprises a first bonding region 503 at the first side 591, and the first flexible circuit board 504 is electrically connected with the touch sensor 502 through the first bonding region 503 only.

Figure 2B:
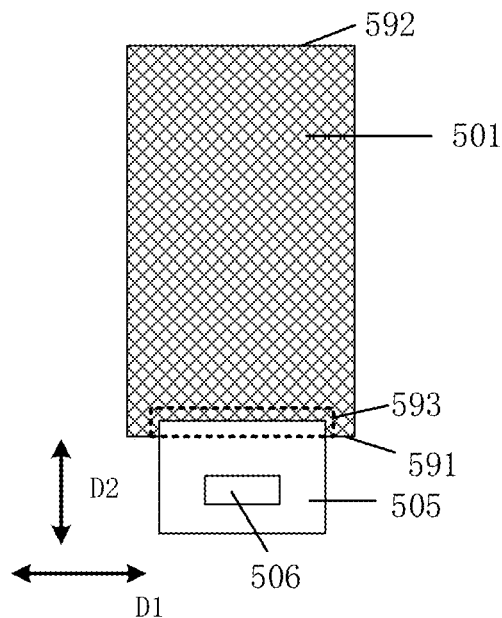
FIG. 2B is a front view of a display substrate and a fourth flexible circuit board of the display module as illustrated in FIG. 1.

FIG. 2B is a front view of the display substrate 501 and the fourth flexible circuit board 505 of the display module as illustrated in FIG. 1. It should be noted that the fourth flexible circuit board 505 as illustrated in FIG. 2B is not in a bending state. As illustrated in FIG. 2B, the display substrate 501 comprises a second bonding region 593 at the first side 591, and the fourth flexible circuit board 505 is electrically connected with the display substrate 501 through the second bonding region 593. As illustrated in FIG. 2B, the fourth flexible circuit board 505 further comprises a drive chip 506.

Figure 2C:
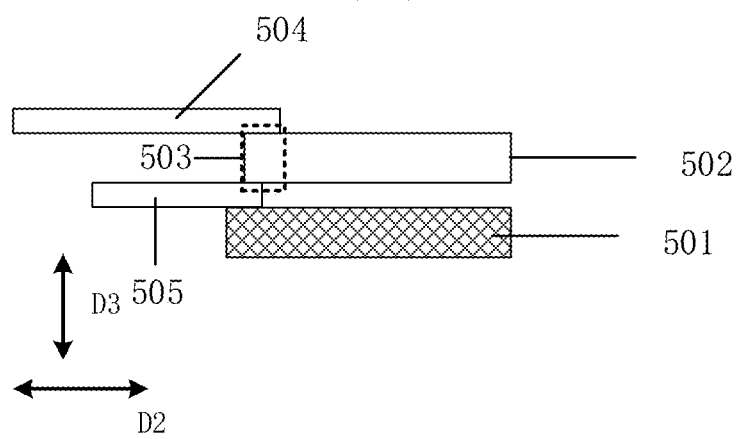
FIG. 2C is a cross-sectional schematic diagram of the display module as illustrated in FIG. 1.

FIG. 2C is a cross-sectional schematic diagram of the display module as illustrated in FIG. 1, and the cross-sectional schematic diagram as illustrated in FIG. 2C is taken along the line AA' in FIG. 1. It should be noted that neither the first flexible circuit board 504 nor the fourth flexible circuit board 505 of the display module as illustrated in FIG. 1 is in a bending state. As illustrated in FIG. 2C, the touch sensor 502 overlaps with the display substrate 501 in a third direction D3, and the touch sensor 502 is located on the display side (i.e., the light emitting side or the image outputting side) of the display substrate 501 in the third direction D3.

Figure 2D:
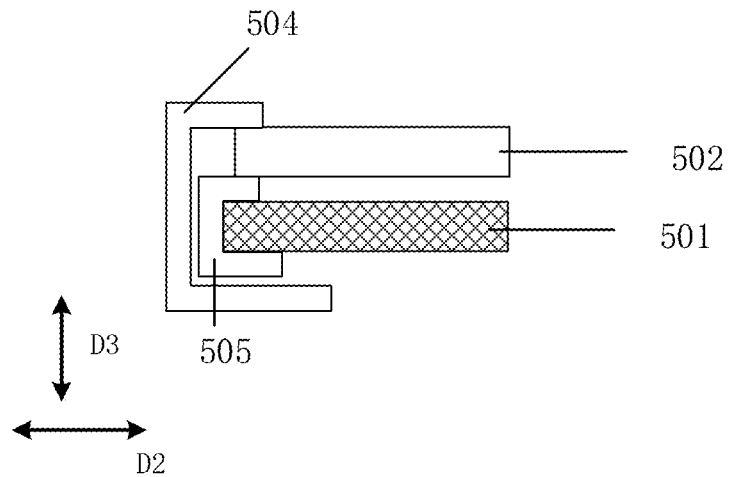
FIG. 2D is another cross-sectional schematic diagram of the display module as illustrated in FIG. 1.

FIG. 2D is another cross-sectional schematic diagram of the display module as illustrated in FIG. 1. Compared with the cross-sectional schematic diagram as illustrated in FIG. 2C, both the first flexible circuit board 504 and the fourth flexible circuit board 505 in the cross-sectional schematic diagram as illustrated in FIG. 2D, are in a bending state. As illustrated in FIG. 2D, a portion of the fourth flexible circuit board 505 (the main body of the fourth flexible circuit board 505) and a portion of the first flexible circuit board 504 are both at the back of the display substrate 501 (that is, the side, which is away from the touch sensor 502, of the display substrate 501) after bending.

Figure 3A:
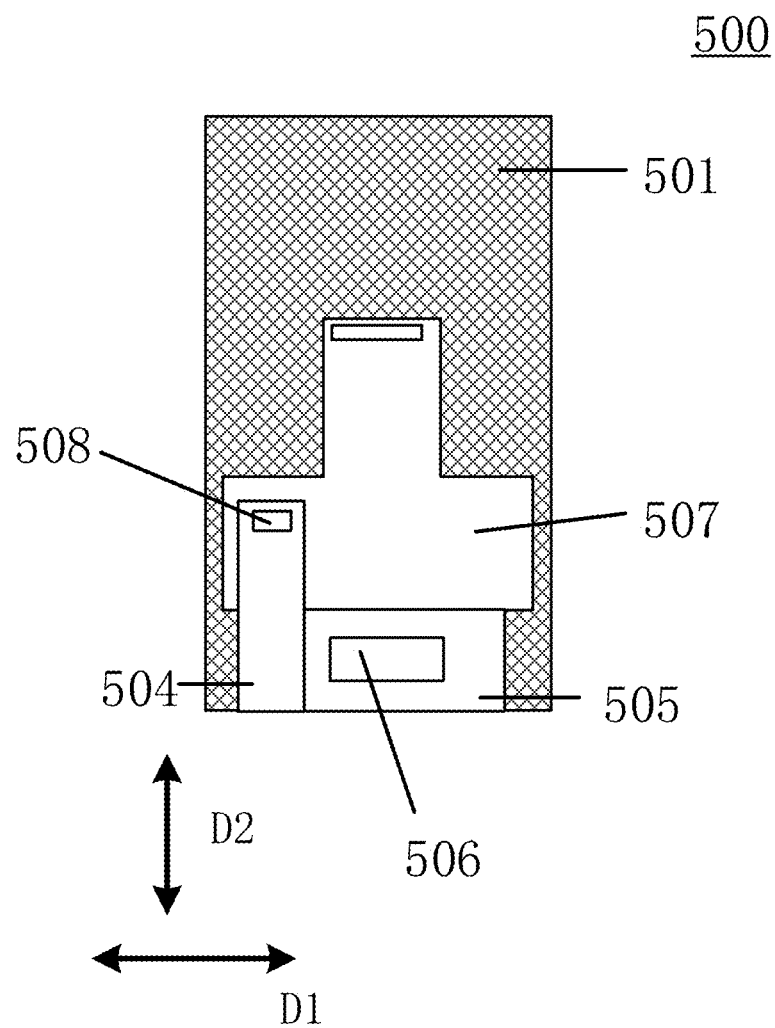
FIG. 3A is a back view of the display module as illustrated in FIG. 1.

FIG. 3A is a back view of the display module as illustrated in FIG. 1 (i.e., a schematic plan view obtained through observing the display module from the back of the display module). As illustrated in FIG. 3A, the display module further comprises a third flexible circuit board 507, and the third flexible circuit board 507 and the fourth flexible circuit board 505 are bonded so as to be electrically connected with each other, so that the third flexible circuit board 507 can control a drive chip 506 through the fourth flexible circuit board 505 and control the display substrate 501 through the drive chip 506 to realize a display function. The third flexible circuit board 507 is also bonded and electrically connected with the first flexible circuit board 504 through the electrical connection region 508, so that the third flexible circuit board 507 can control the touch sensor 502 through the first flexible circuit board 504 to realize a touch function. As illustrated in FIG. 3A, the drive chip 506 is located on the side, away from the display substrate 501, of the main body of the fourth flexible circuit board 505. As illustrated in FIG. 3A, the first flexible circuit board 504 is only located at one side of the drive chip 506 in the first direction D1, that is, the first flexible circuit board 504 is bonded and connected with the touch sensor 502 in a manner of disposing wires on a single side. For example, the first direction D1, the second direction D2 and the third direction D3 intersects with each other (e.g., are perpendicular to each other).

Figure 3B:
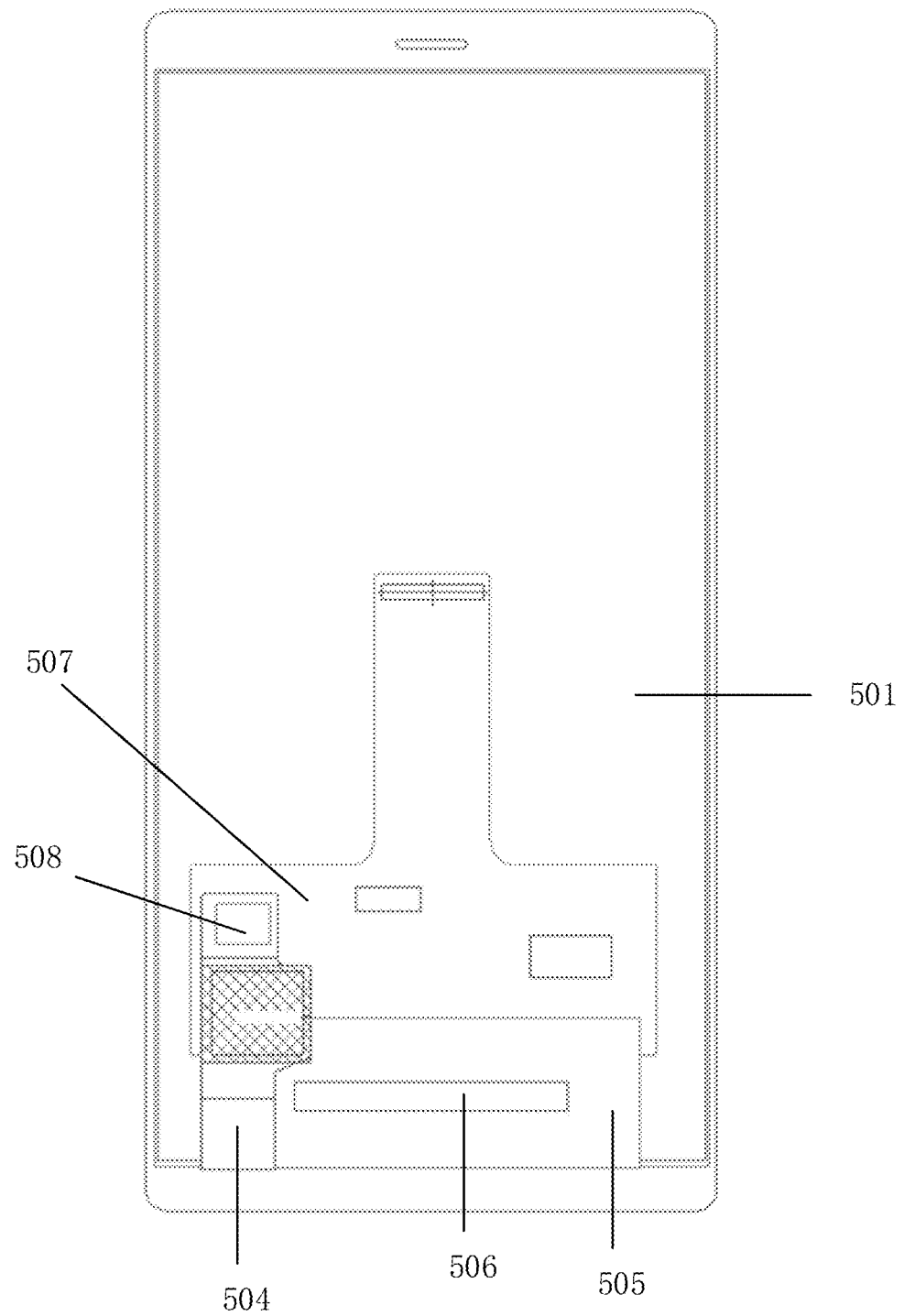
FIG. 3B is a back view of another display module.

It should be noted that the shapes, connections, and arrangements of the first flexible circuit board 504, the fourth flexible circuit board 505 and the third flexible circuit board 507 as illustrated in FIG. 1 and FIG. 3A are only examples, and embodiments of the present disclosure are not limited thereto. FIG. 3A is a back view of another display module. For example, the shape, connection, and arrangement of the first flexible circuit board 504, the fourth flexible circuit board 505 and the third flexible circuit board 507 in FIG. 3A may also adopt the example as illustrated in FIG. 3B.

Figure 4A:
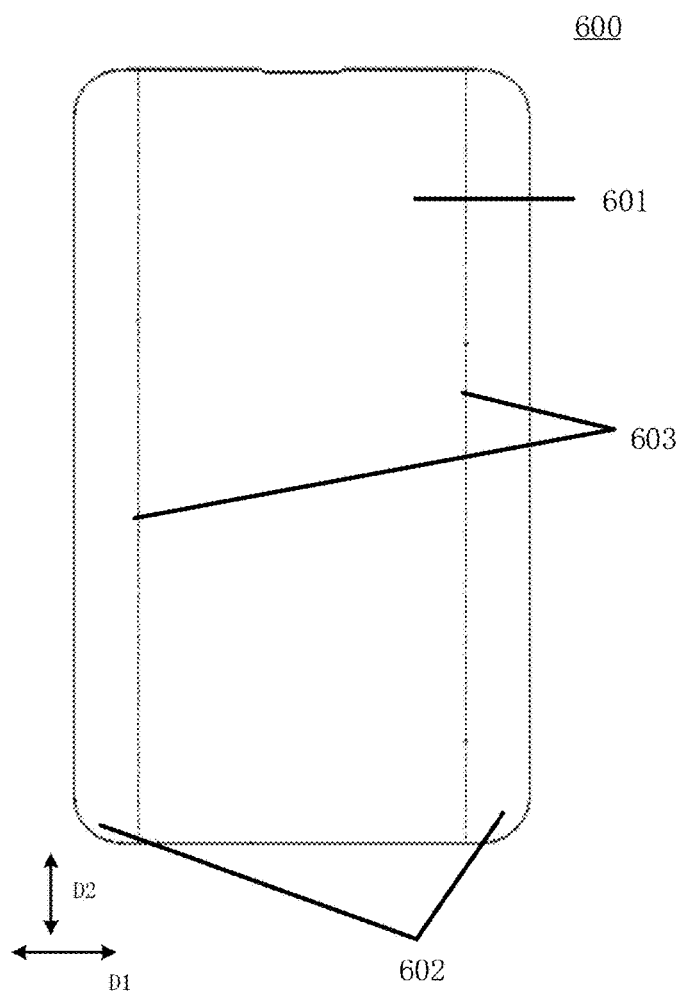
FIG. 4A is a front view of further another display module.
Figure 4B:
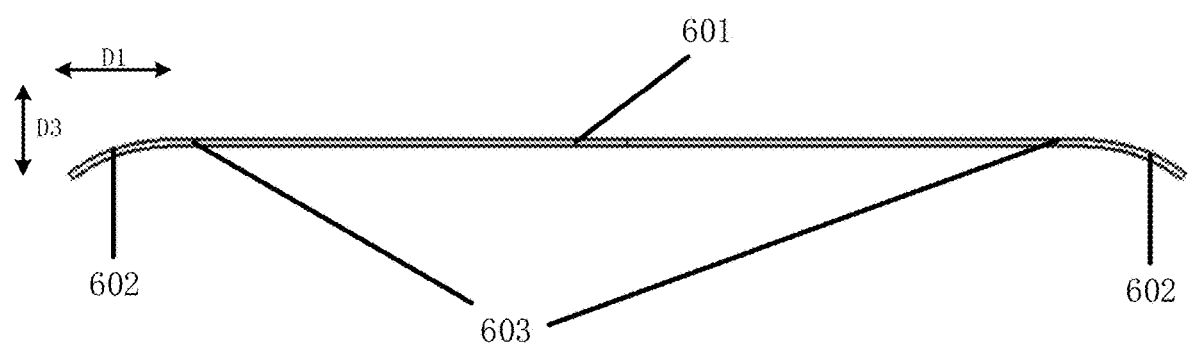
FIG. 4B is a top view of the display module as illustrated in FIG. 4A.
Figure 4C:
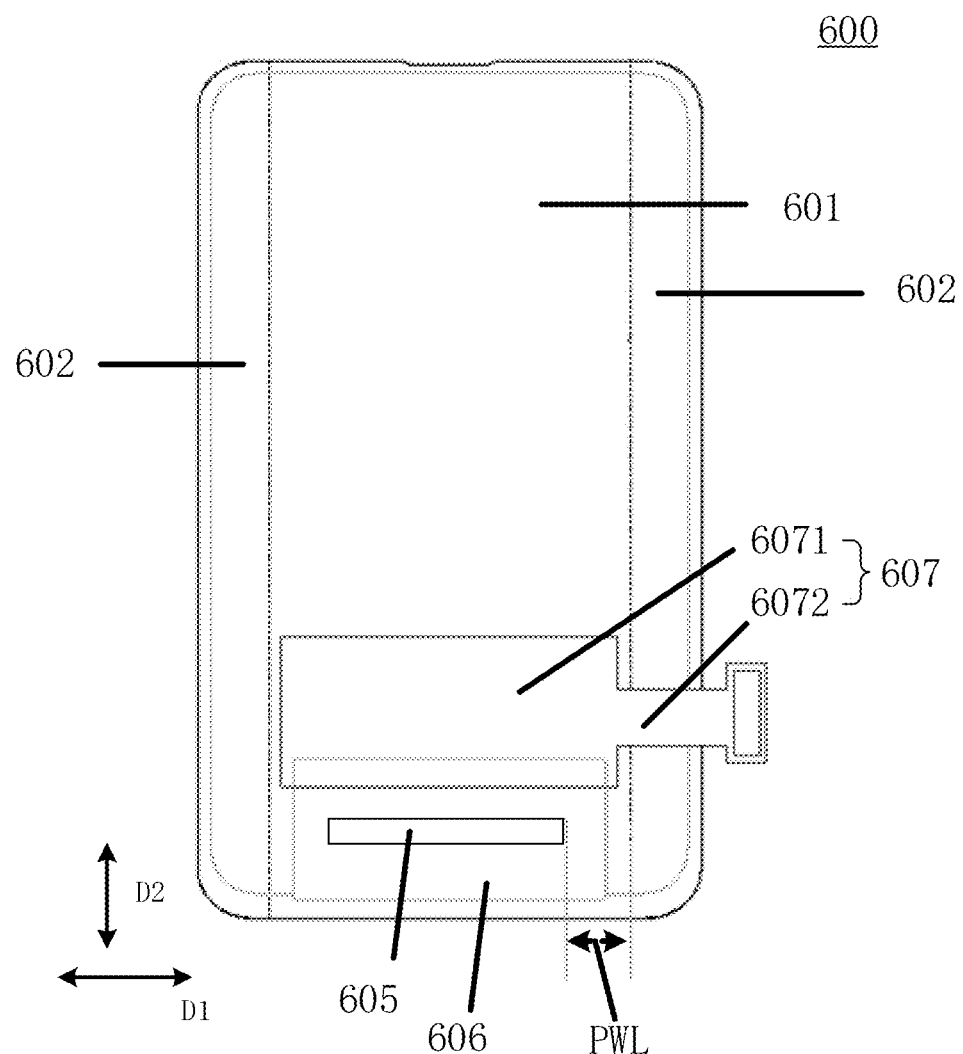
FIG. 4C is a back view of the display module as illustrated in FIG. 4A.

In research, the inventors of the present disclosure have noted that the way that the first flexible circuit board 504 is bonded and connected with the touch sensor 502 by a manner of disposing wires on a single-side, illustrated in FIG. 1 is not suitable for a display module with a curved surface region (e.g., a curved screen), and the following is an exemplary description with reference to FIGS. 4A-4C.

FIG. 4A is a front view of another display module 600. As illustrated in FIG. 4A, the display module 600 comprises a flat region 601, and curved surface regions 602 which are respectively located on both sides of the flat region 601 in the first direction D1, and a virtual dividing line (which can also be referred to as a bending start line 603) is between the flat region 601 and a curved surface region 602. FIG. 4B is a top view of the display module 600 as illustrated in FIG. 4A. As illustrated in FIG. 4B, the curved surface region 602 of the display module 600 is bent from the front of the display module 600 toward the back of the display module 600.

FIG. 4C is a back view of the display module 600 illustrated in FIG. 4A. As illustrated in FIG. 4C, the display module 600 comprises a display substrate (not illustrated in the figure), a touch sensor (not illustrated in the figure), a first flexible circuit board (i.e., a circuit board for the touch sensor, not illustrated in the figure), a fourth flexible circuit board 606 and a third flexible circuit board 607. The touch sensor is arranged on the display side of the display substrate; the first flexible circuit board (i.e., the circuit board for the touch sensor) is bonded with the touch sensor to electrically connect with the touch sensor, and the third flexible circuit board 607 is bonded with the first flexible circuit board to electrically connect with the first flexible circuit board, so that the third flexible circuit board 607 can control the touch sensor through the first flexible circuit board to realize a touch function. The fourth flexible circuit board 606 is bonded with the display substrate of the display module 600 and thus electrically connected with the display substrate, so that the drive chip 605 included in the fourth flexible circuit board 606 can control the display substrate through the fourth flexible circuit board 606 to realize the display function. The third flexible circuit board 607 is bonded with the fourth flexible circuit board 606 and thus electrically connected with the fourth flexible circuit board 606, so that the third flexible circuit board 607 can be electrically connected with the drive chip 605 through the fourth flexible circuit board 606.

As illustrated in FIG. 4C, the third flexible circuit board 607 comprises a main body 6071 and a connection portion 6072 protruding from the main body 6071. As illustrated in FIG. 4C, the portion, which is at the back of the display substrate after the fourth flexible circuit board 606 is bent, of the fourth flexible circuit board 606 (the main body of the fourth flexible circuit board 606), the drive chip 605 and the main body 6071 of the third flexible circuit board 607 are all arranged in the flat region 601, this is because materials of the main body of the fourth flexible circuit board 606, the drive chip 605 and the main body 6071 of the third flexible circuit board 607 are relatively hard. Arranging the main body of the fourth flexible circuit board 606, the drive chip 605 and the main body 6071 of the third flexible circuit board 607 in the flat region 601 can avoid defects caused by bending the main body of the fourth flexible circuit board 606, the drive chip 605 and the main body 6071 of the third flexible circuit board 607.

The inventors of the present disclosure have noted that, for the display module 600 with the curved surface region 602 (e.g., a curved screen), a layout space (the space for arranging wires of the first flexible circuit board) reserved for the first flexible circuit board (i.e., the circuit board for the touch sensor) of the display module 600 with the curved surface region 602 is small because of the following reasons. First, because the drive chip 605 is the core electronic component of the display module 600, in order to avoid defects caused due to that the drive chip 605 is covered by hard materials, it is necessary to avoid that the drive chip 605 is covered by the first flexible circuit board. Secondly, a plurality of wires of the drive chip 605 bonded with the display substrate through the fourth flexible circuit board 606 respectively extend along the second direction D2 and are arranged in parallel along the first direction D1; in order to avoid the potential electrical non-uniformity and brightness non-uniformity of the display substrate along the first direction D1 caused by large differences in the lengths of the plurality of wires, the center of the drive chip 605 in the first direction D1 overlaps with or is close to the center of the display substrate in the first direction Dl. Thirdly, because the display module 600 comprises the curved surface region 602, the size of the flat region 601 in the first direction D1 is relatively small. Therefore, in the case where the center of the drive chip 605 in the first direction D1 overlaps with or is close to the center of the display substrate in the first direction D1, and the first flexible circuit board does not cover the drive chip 605, the value of the distance between each end of the drive chip 605 in the first direction D1 and a corresponding virtual boundary line (i.e., the size of the wiring region PWL available for the first flexible circuit board) is small. For example, in the case where the width of the curved surface region 602 in the first direction D1 is large, if the first flexible circuit board is bonded and connected with the touch sensor by a manner of disposing wires on a single-side, the size of the wiring region PWL available for the first flexible circuit board in the first direction D1 cannot meet the requirements of arranging wires of the first flexible circuit board (for example, the first flexible circuit board can only be bonded with part of the wires of the touch sensor).

At least one embodiment of the present disclosure provides a display module and a display device. The display module comprises a first flexible circuit board, a display substrate, and a touch sensor disposed on the display side of the display substrate. The display substrate comprises a flat region and curved surface regions respectively on two sides of the flat region in a first direction; the touch sensor comprises a first bonding region and a second bonding region on a first side of a second direction intersecting with the first direction; the first bonding region and the second bonding region are on a surface, away from the display substrate, of the touch sensor, and the first bonding region and the second bonding region are stacked with the flat region and are spaced apart from each other; the first flexible circuit board is electrically connected with the touch sensor through the first bonding region and the second bonding region; the first flexible circuit board comprises a main body, and a first bonding connection portion and a second bonding connection portion which protrude from the main body and are spaced apart from each other; the first bonding connection portion is bonded with the first bonding region so as to be electrically connected with the first bonding region, and the second bonding connection portion is bonded with the second bonding region so as to be electrically connected with the second bonding region. For example, the display module can utilize the space on the back of the display module more effectively and realize the bonding of the touch sensor and the first flexible circuit board.

Non-limitative descriptions are given to the display module provided by the embodiments of the present disclosure in the following with reference to a plurality of examples or embodiments. As described in the following, in case of no conflict, different features in these specific examples or embodiments can be combined so as to obtain new examples, and the new examples or embodiments are also fall within the scope of present disclosure.

Figure 5:
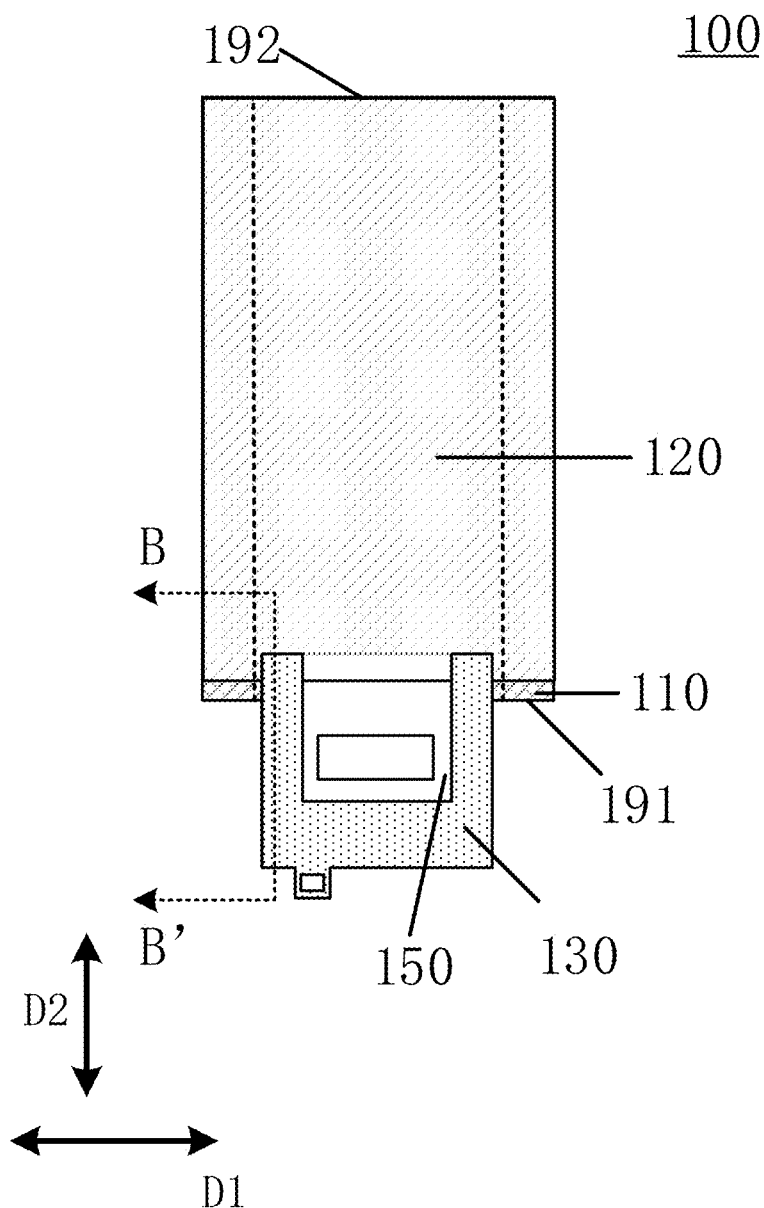
FIG. 5 is a front view of a display module provided by at least one embodiment of the present disclosure.

FIG. 5 is a front view of a display module 100 provided by at least one embodiment of the present disclosure. For example, the display module 100 may be an active matrix organic light emitting diode display screen. As illustrated in FIG. 5, the display module 100 comprises a display substrate 110 (for example, an organic light emitting diode display panel) and a touch sensor 120 disposed on the display side of the display substrate 110. As illustrated in FIG. 5, the display module 100 further comprises a first flexible circuit board 130 (i.e., a circuit board for the touch sensor) and a fourth flexible circuit board 150 (e.g., chip on film). It should be noted that neither the first flexible circuit board 130 nor the fourth flexible circuit board 150 of the display module 100 as illustrated in FIG. 5 is in a bending state. For example, the top view of the display module 100 as illustrated in FIG. 5 may be similar to the top view of the display module as illustrated in FIG. 4B, and will not be described again.

For example, as illustrated in FIG. 5, the second direction D2 intersecting with the first direction D1 has a first side 191 and a second side 192. For example, the first side 191 and the second side 192 of the second direction D2 are used to illustrate two sides in the second direction D2 of the display module 100 and to illustrate two sides in the second direction D2 of components of the display module 100. For example, the first side 191 and the second side 192 of the second direction D2 can be used to respectively represent the first side and the second side of the display module 100 in the second direction D2. For another example, the first side 191 and the second side 192 of the second direction D2 can be used to respectively represent the first side and the second side of the display substrate 110 in the second direction D2. For another example, the first side 191 and the second side 192 of the second direction D2 can be used to respectively represent the first side and the second side of the touch sensor 120 in the second direction D2.

Figure 6A:
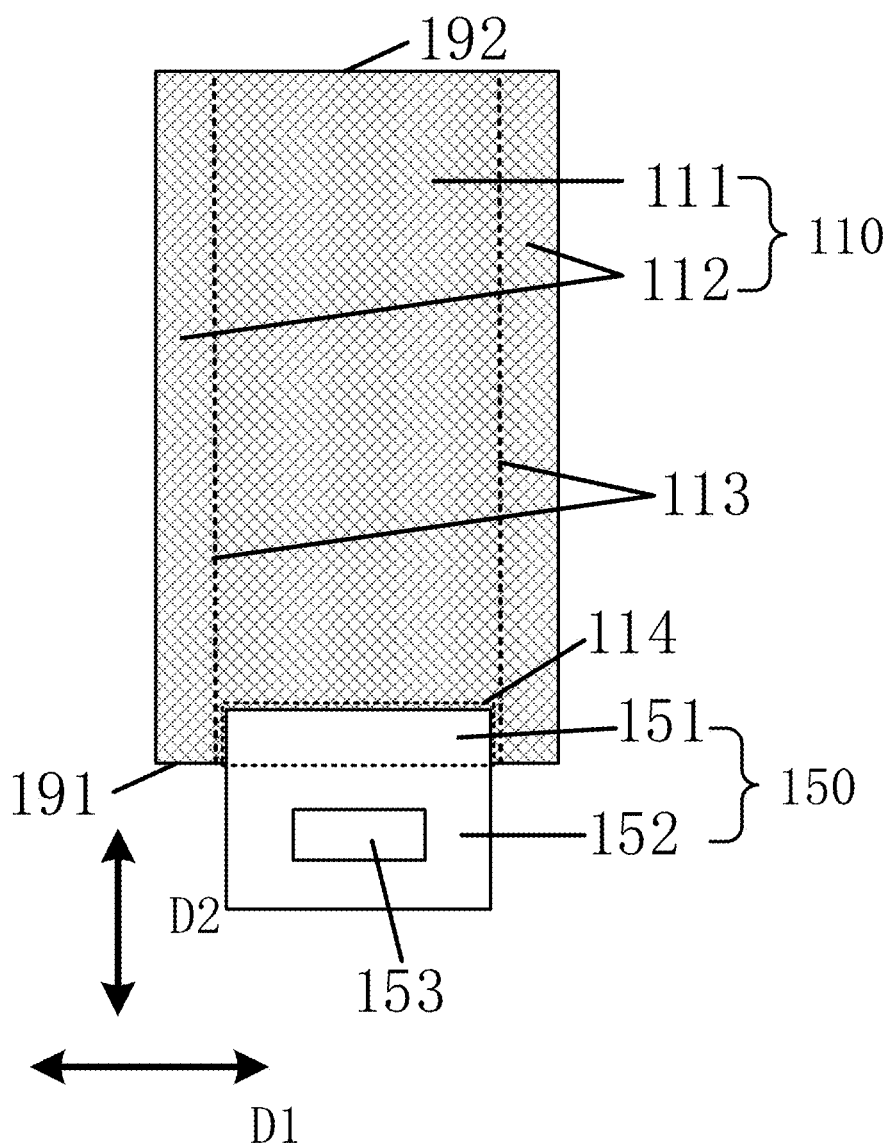
FIG. 6A is a front view of a display substrate and a fourth flexible circuit board of the display module as illustrated in FIG. 5.

FIG. 6A is a front view of the display substrate 110 and a fourth flexible circuit board 150 of the display module 100 as illustrated in FIG. 5. As illustrated in FIG. 6A, the display substrate 110 comprises a flat region 111, and curved surface regions 112 which are respectively located on two sides of the flat region 111 in the first direction D1, and a virtual boundary line 113 (may also be referred to as a bending start line 113) is provided between the flat region 111 and a curved surface regions 112. It should be noted that the flat region 111, the curved surface region 112 and the bending start line 113 of the display substrate 110 respectively correspond to the flat region, the curved surface region, and the bending start line of the display module 100.

Figure 6B:
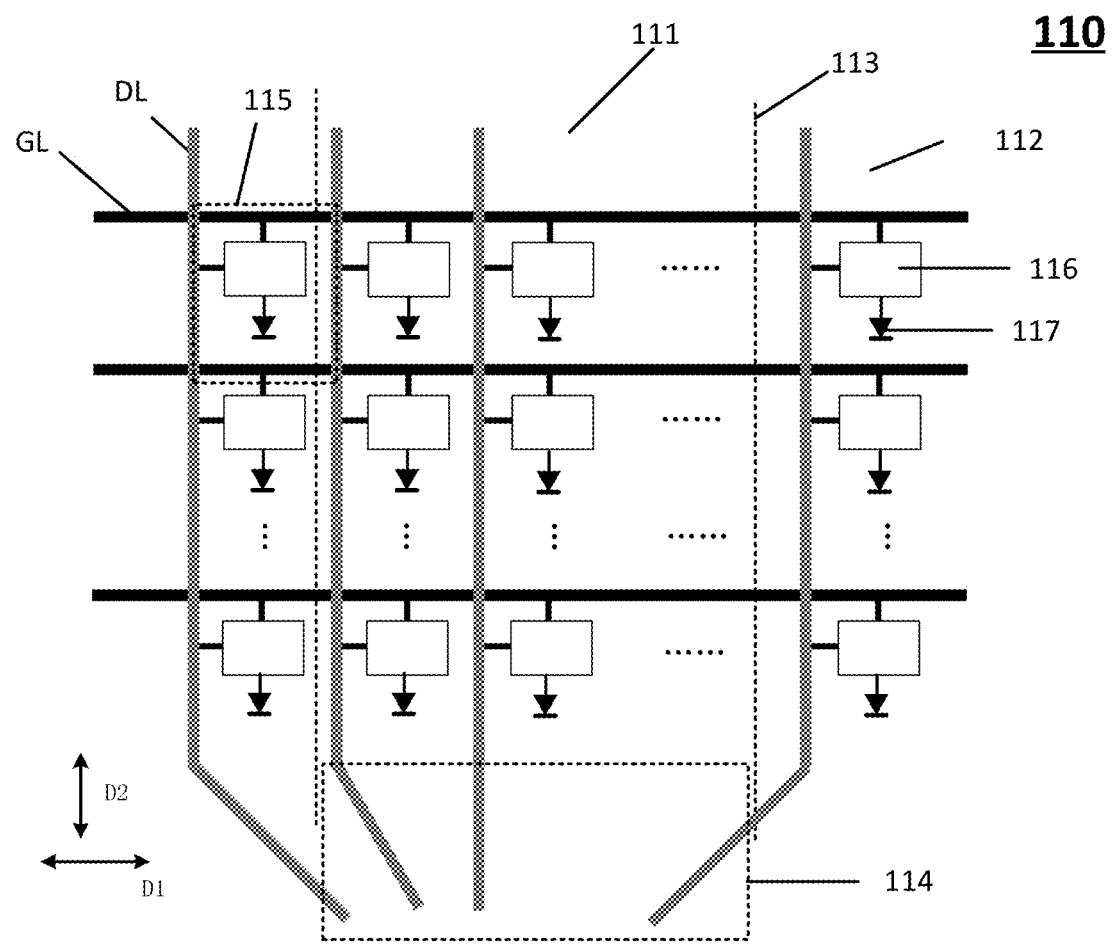
FIG. 6B is an example of the display substrate illustrated in FIG. 6A.

FIG. 6B is an example of the display substrate 110 as illustrated in FIG. 6A. For example, as illustrated in FIG. 6B, the display substrate 110 comprises a plurality of display pixel units 115 arranged in an array, and the plurality of display pixel units 115 are not only arranged in the flat region 111, but also arranged in the curved surface regions 112 respectively on the two sides of the flat region 111. It should be noted that, in other examples, the plurality of display pixel units 115 may be arranged only in the flat region 111, and there is no display pixel unit in the curved surface region 112.

For example, as illustrated in FIG. 6B, each of the plurality of display pixel units 115 comprises a pixel drive circuit 116 and a light emitting component 117 corresponding to the pixel drive circuit 116. For example, the light emitting component 117 is an organic light emitting component; for example, the organic light emitting component is an organic light emitting diode. For example, the pixel drive circuit 116 may be implemented as a 2T1C pixel drive circuit, i.e., a circuit including two thin film transistors (i.e., a drive transistor and a switch transistor) and a storage capacitor, but embodiments of the present disclosure are not limited thereto. For another example, the pixel drive circuit 116 may be implemented as a pixel drive circuit including other suitable numbers of transistors and capacitors (e.g., a 3T1C circuit). For example, the display substrate 110 further comprises a plurality of gate lines GL and a plurality of data lines DL, the plurality of gate lines GL intersect the plurality of data lines DL to define the plurality of display pixel units 115. For example, the data line DL is configured to connect the source electrode of the switch transistor or the drain electrode of the switch transistor, to provide a data signal for display to the switch transistor; the gate line GL is configured to connect the gate of the switch transistor, to provide a gate scanning signal to the switch transistor.

As illustrated in FIG. 6A, the display substrate 110 further comprises a third bonding region 114 located on the flat region 111 (for example, the third bonding region 114 is located on the first side 191 of the display module 100). The fourth flexible circuit board 150 comprises a third bonding connection portion 151, and the fourth flexible circuit board 150 is bonded with the display substrate 110 through the third bonding connection portion 151 and the third bonding region 114, so as to allow the fourth flexible circuit board 150 to be electrically connected with the display substrate 110. For example, as illustrated in FIG. 6B, the plurality of data lines DL of the display substrate 110 extend into the third bonding region 114 (one end of each of the plurality of data lines DL is in the third bonding region 114), so as to allow the plurality of data lines DL to be bonded with the third bonding connection portion 151 of the fourth flexible circuit board 150.

As illustrated in FIG. 6A, the fourth flexible circuit board 150 further comprises a main body 152 connected with the third bonding connection portion 151 and a drive chip 153 disposed on the main body 152 of the fourth flexible circuit board 150. The drive chip 153 is bonded with the display substrate 110 through the fourth flexible circuit board 150 and thus electrically connected to the display substrate 110, so that the drive chip 153 included in the fourth flexible circuit board 150 can drive the display substrate 110 through the fourth flexible circuit board 150. For example, the drive chip 153 comprises a data driver, a timing controller T-Con, etc. The data driver of the drive chip 153 may provide data signals for display to the plurality of data lines DL through the fourth flexible circuit board 150. For example, the display module further comprises a gate driver on array (GOA) on the array substrate, and the plurality of output terminals of the GOA are respectively connected with the plurality of gate lines GL to provide gate scanning signals to the plurality of gate lines GL.

Figure 9:
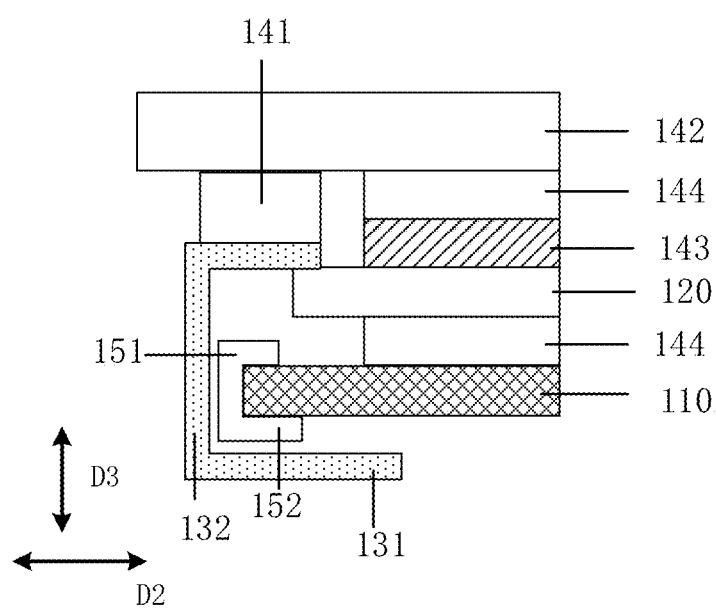
FIG. 9 is another cross-sectional schematic diagram of the display module as illustrated in FIG. 5.

It should be noted that the fourth flexible circuit board 150 as illustrated in FIG. 6A (for example, the third bonding connection portion 151 of the fourth flexible circuit board 150) is not in a bending state. However, in a final product including the display module 100, the fourth flexible circuit board 150 (e.g., the third bonding connection portion 151 of the fourth flexible circuit board 150) is in a bending state, and the main body 152 of the fourth flexible circuit board 150 is located on the side, away from the touch sensor 120, of the display substrate 110 (i.e., is located on the back of the display substrate 110 after the fourth flexible circuit board 150 is bent); the drive chip 153 is located on the side, away from the touch sensor 120, of the display substrate 110 (for example, the drive chip 153 is located on a side, away from the touch sensor 120, of the main body 152 of the fourth flexible circuit board 150). These contents are described in detail in the following example as illustrated in FIG. 9, and are not repeated here.

Figure 7A:
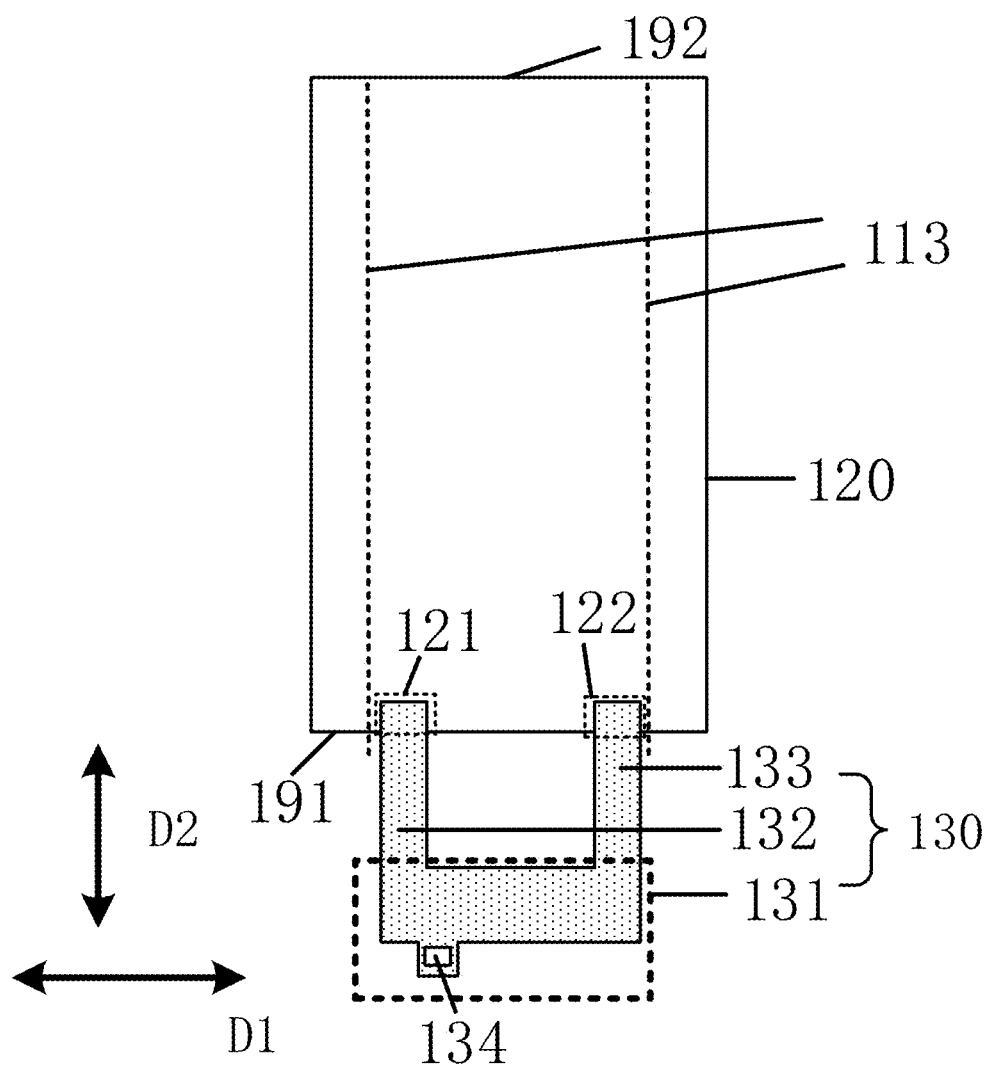
FIG. 7A is a front view of a touch sensor and a first flexible circuit board of the display module as illustrated in FIG. 5.

FIG. 7A is a front view of the touch sensor 120 and the first flexible circuit board 130 of the display module 100 as illustrated in FIG. 5. It should be noted that, for convenience of description, FIG. 7A also shows the bending start lines 113 of the display substrate 110. It can be understood that the regions of the touch sensor 120 located on two sides of the bending start lines 113 are in a bending state in the final product of the display module 100, that is, the regions of the touch sensor 120 respectively located on the two sides of the bending start lines 113 serve as curved surface regions of the touch sensor 120 in the final product of the display module 100. As illustrated in FIG. 5 and FIG. 7A, the touch sensor 120 has a first bonding region 121 and a second bonding region 122 on the first side of the second direction intersecting with the first direction. The first bonding region 121 and the second bonding region 122 are located on a surface of the touch sensor 120 on the side, away from the display substrate 110, of the touch sensor 120, the first bonding region 121 and the second bonding region 122 are stacked with the flat region 111 and are spaced apart from each other. For example, neither the first bonding region 121 nor the second bonding region 122 is stacked with the curved surface region 112. For example, the orthographic projection of the first bonding region 121 and the second bonding region 122 on the display substrate 110 (for example, the orthographic projection on the layer where the flat region 111 of the display substrate 110 is located) is located in the flat region 111.

For example, as illustrated in FIG. 5, the third bonding region 114 partially overlaps with an orthographic projection of the first bonding region 121 on the flat region 111 of the display substrate and an orthographic projection of the second bonding region 122 on the flat region 111 of the display substrate. For another example, the third bonding region 114 is located between the orthographic projection of the first bonding region 121 on the flat region 111 of the display substrate and the orthographic projection of the second bonding region 122 on the flat region 111 of the display substrate.

It should be noted that the first side of the touch sensor 120 of the second direction intersecting with the first direction refers to the first side of the touch sensor 120 in the second direction. The first side of the touch sensor 120 in the second direction corresponds to the first side of the display module.

For example, by allowing the touch sensor 120 to have the first bonding region 121 and the second bonding region 122 on the first side 191 of the second direction D2 intersecting with the first direction D1, the first bonding region 121 and the second bonding region 122 are stacked with the flat region 111 and are spaced apart from each other, and the first flexible circuit board 130 is electrically connected with the touch sensor 120 through the first bonding region 121 and the second bonding region 122, and thus the space on the back of the display module 100 can be effectively utilized, and the size of the wiring region available for the first flexible circuit board 130 (the overall width of the wiring region available for the first flexible circuit board 130 in the first direction D1) can be increased, so that the bonding and connection between the first flexible circuit board 130 and the touch sensor 120 can be realized in the case where the display module 100 comprises curved surface regions and the position of a drive chip 153 in the first direction D1 is not changed. Therefore, potential electrical unevenness and brightness unevenness of the display substrate 110 along the first direction D1 caused by changing the position of the drive chip 153 in the first direction D1 can be avoided.

Figure 7B:
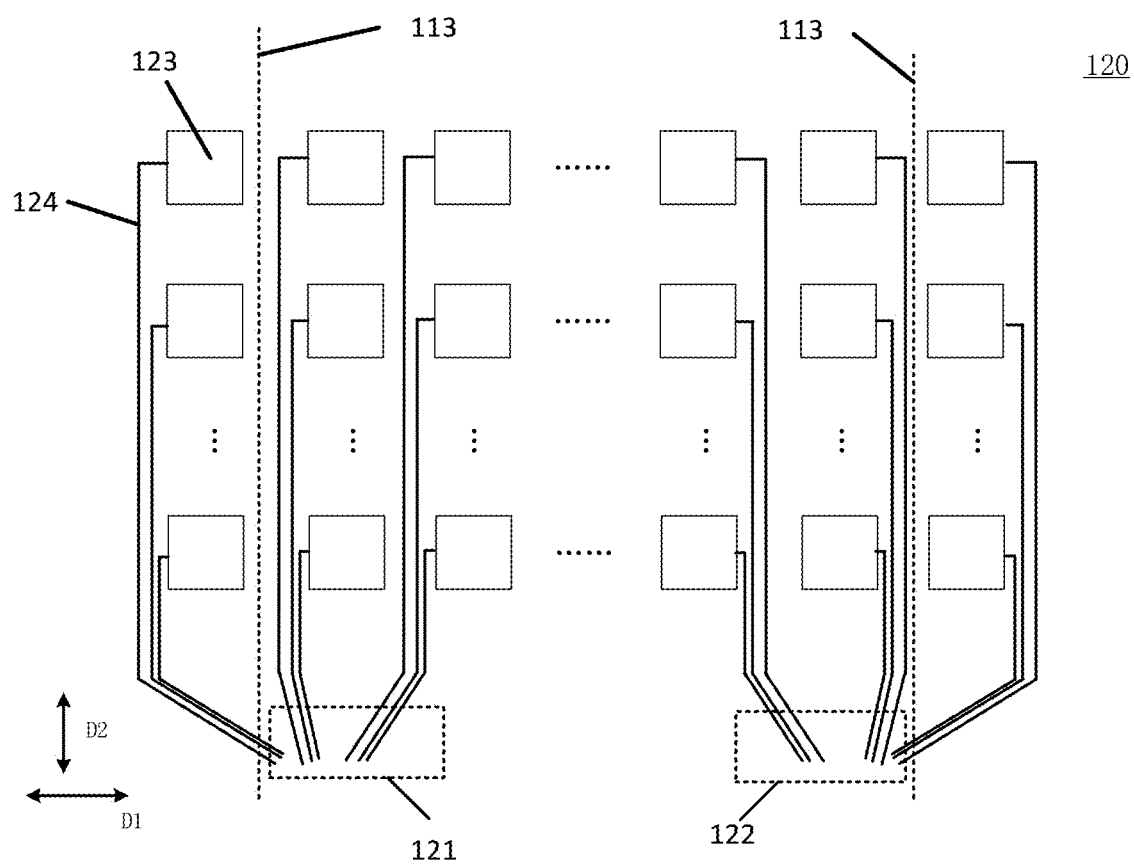
FIG. 7B is an example of the touch sensor as illustrated in FIG. 7A.

FIG. 7B is an example of the touch sensor 120 as illustrated in FIG. 7A. For example, as illustrated in FIG. 7B, the touch sensor 120 is an add-on mode touch panel, the touch sensor 120 and the display substrate are separately manufactured and then the touch sensor 120 is attached onto the display side of the display substrate.

For example, as illustrated in FIG. 7B, the touch sensor 120 comprises a plurality of self-capacitance electrodes 123 arranged in an array and a plurality of wires 124 electrically connected with the plurality of self-capacitance electrodes 123, that is, the touch sensor 120 is a self-capacitance touch sensor. For example, as illustrated in FIG. 7B, the plurality of self-capacitance electrodes 123 are not only arranged in the flat region of the display module 100, but also in the curved surface regions of the display module 100, that is, orthographic projections of the plurality of self-capacitance electrodes 123 on the display substrate 110 are located not only in the flat region 111, but also in the two curved surface regions 112 on the two sides of the flat region 111. It should be noted that in other examples, the plurality of self-capacitance electrodes 123 may be only stacked with the flat region 111 but not stacked with the curved surface region 112, that is, the orthographic projections of the plurality of self-capacitance electrodes 123 on the display substrate 110 are only located in the flat region 111, and are not in the two curved surface regions 112 on the two sides of the flat region 111. For example, as illustrated in FIG. 7B, part of the plurality of wires 124 extend to the first bonding region 121 of the touch sensor 120, and another part of the plurality of wires 124 extend to the second bonding region 122 of the touch sensor 120.

For example, as illustrated in FIG. 7A, the first flexible circuit board 130 comprises a main body 131, and a first bonding connection portion 132 and a second bonding connection portion 133 that protrude from the main body 131 of the first flexible circuit board 130 and are spaced apart from each other. The first bonding connection portion 132 is bonded with the first bonding region 121 (for example, wires 124 in the first bonding region 121), so as to allow the first bonding connection portion 132 and the first bonding region 121 to be electrically connected with each other, and the second bonding connection portion 133 is bonded with the second bonding region 122 (for example, wires 124 in the second bonding region 122), so as to allow the second bonding connection portion 133 and the second bonding region 122 to be electrically connected with each other. For example, the first flexible circuit board 130 further comprises a touch detection chip (not illustrated in the figure). For example, the touch detection chip is disposed on the main body 131 of the first flexible circuit board 130. For example, the touch detection chip is configured to apply drive signals to the plurality of self-capacitance electrodes 123 through the first flexible circuit board 130 and the plurality of wires 124, and is further configured to receive feedback signals provided by the plurality of self-capacitance electrodes 123 through the first flexible circuit board 130 and the plurality of wires 124, and confirm whether or not a self-capacitance electrode 123 is touched and where the touched self-capacitance electrode 123 is located (i.e., touch position) based on the feedback signals.

It should be noted that, for convenience of description, the first flexible circuit board 130 illustrated in FIG. 7A is not in a bending state. However, in the final product including the display module 100, the first flexible circuit board 130 is in a bending state, the main body 131 of the first flexible circuit board 130 is located on the side, away from the touch sensor 120, of the display substrate 110 (that is, on the back of the display substrate 110 after the first flexible circuit board 130 is bent), and the touch detection chip is located on the side, away from the touch sensor 120, of the main body 131 of the first flexible circuit board 130, this is described in detail in the example as illustrated in FIG. 9.

It should be noted that the touch sensor 120 is not limited to be implemented as a self-capacitance touch screen, and may also be implemented as a mutual capacitance touch screen. In this case, for example, the touch sensor 120 may comprise two layers of stripe-shape electrodes (each layer comprises a plurality of stripe-shape electrodes arranged in parallel), in which electrodes in different layers are in different planes and intersect with each other, and the above two layers of stripe-shape electrodes are respectively configured as touch drive electrodes of the touch sensor 120 and touch sensing electrodes of the touch sensor 120. For example, the touch drive electrode and the touch sensing electrode may be made of transparent conductive oxide. The transparent conductive oxide, for example, may be an indium tin oxide (ITO). For example, the plurality of mutual capacitances arranged in the array are generated by coupling of the touch drive electrodes and the touch sensing electrodes which are in different planes and intersect with each other. When a finger touches the screen, the capacitance value of the mutual capacitance in the region corresponding to the finger changes. For example, the touch detection chip on the first flexible circuit board 130 may provide touch drive signals to the touch drive electrodes through the first flexible circuit board 130 and receive touch sensing signals provided by the touch sensing electrodes through the first flexible circuit board 130. For example, the touch detection chip can determine the position of the point touched by the finger based on the change of the current corresponding to the values of the plurality of mutual capacitances, before and after the finger touches.

Figure 8:
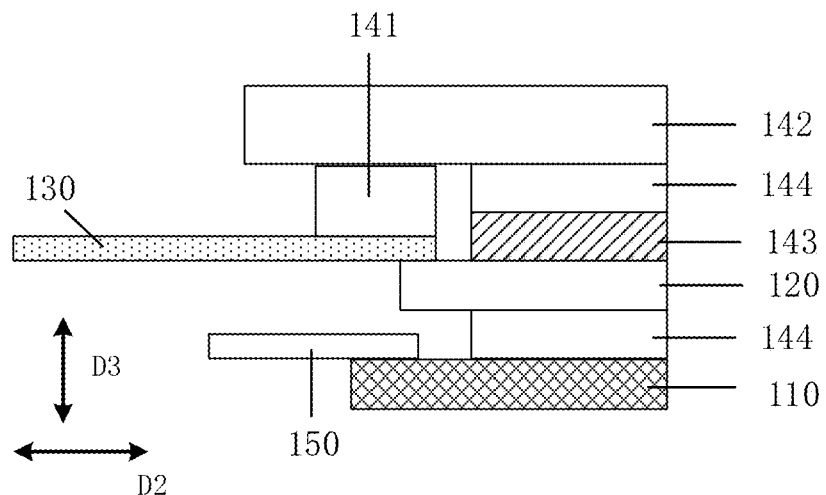
FIG. 8 is a cross-sectional schematic diagram of the display module as illustrated in FIG. 5.

FIG. 8 is a cross-sectional schematic diagram of the display module 100 as illustrated in FIG. 5, and the cross-sectional schematic diagram as illustrated in FIG. 8 is taken along the BB' line in FIG. 5. It should be noted that, for convenience of description, neither the first flexible circuit board 130 nor the fourth flexible circuit board 150 of the display module 100 as illustrated in FIG. 8 is in a bending state. As illustrated in FIG. 8, the touch sensor 120 and the display substrate 110 are stacked in the third direction D3, and the touch sensor 120 is located on the display side (i.e., the light emitting side or the image output side) of the display substrate 110 in the third direction D3. For example, the first direction D1, the second direction D2 and the third direction D3 intersect with each other (e.g., are perpendicular to each other).

FIG. 9 is another schematic cross-sectional view of the display module 100 as illustrated in FIG. 5. Compared with the schematic cross-sectional view as illustrated in FIG. 8, in the schematic cross-sectional view as illustrated in FIG. 9, both the first flexible circuit board 130 and the fourth flexible circuit board 150 are in a bending state. As illustrated in FIG. 9, part of the fourth flexible circuit board 150 (the main body 152 of the fourth flexible circuit board 150) and part of the first flexible circuit board 130 (the main body 131 of the first flexible circuit board 130, part of the first bonding connection portion 132 of the first flexible circuit board 130 and part of the second bonding connection portion 133 of the first flexible circuit board 130) are provided at the back of the display substrate 110 (i.e., the side, away from the touch sensor 120, of the display substrate 110) through bending the fourth flexible circuit board 150 and the first flexible circuit board 130.

Figure 10:
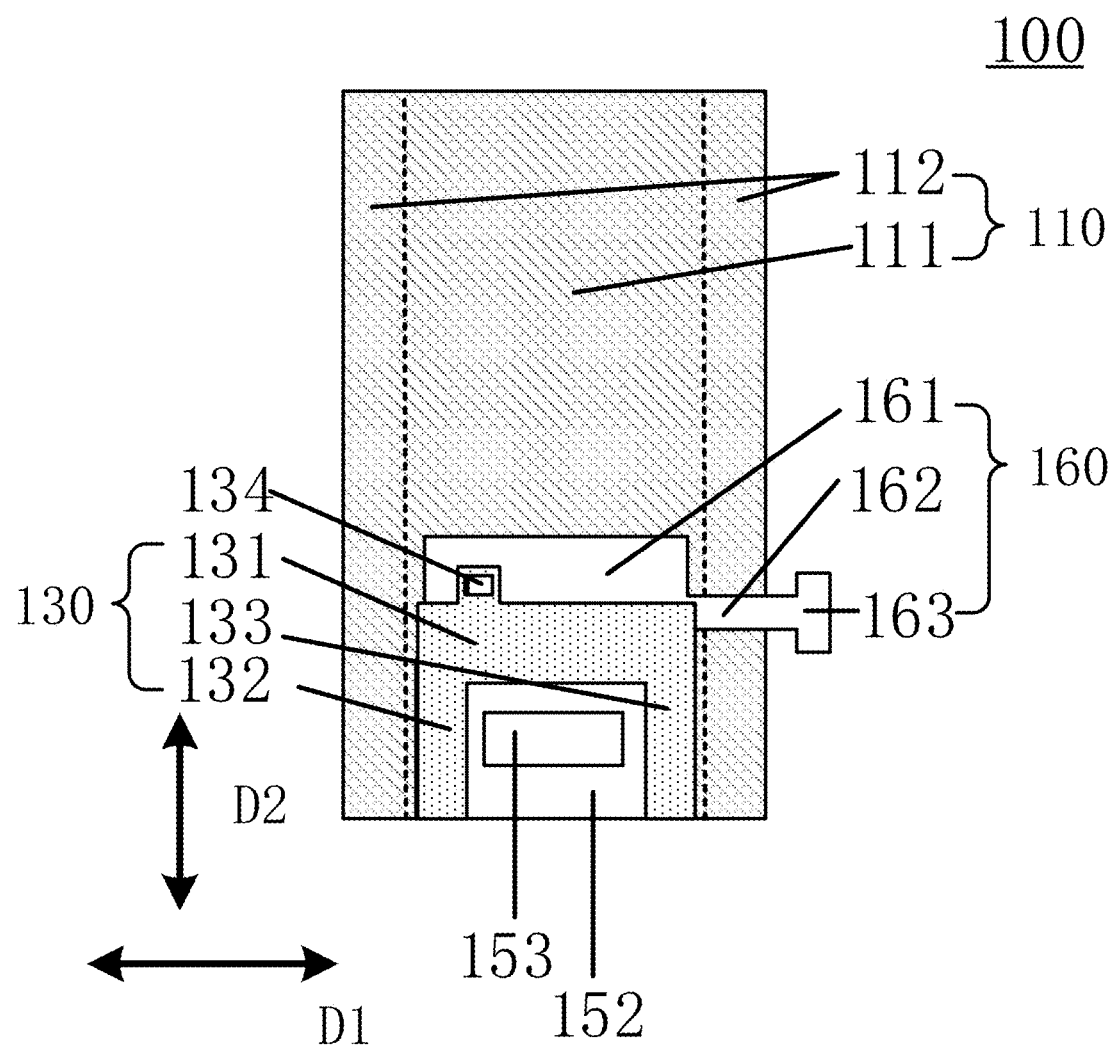
FIG. 10 is a back view of the display module as illustrated in FIG. 5.

FIG. 10 is a back view of the display module 100 as illustrated in FIG. 5 (i.e., a schematic plan view obtained through observing the display module 100 from the back of the display module 100). For example, the display module 100 further comprises a third flexible circuit board (that is, the main circuit board of the display module 100). For convenience of description, the third flexible circuit board 160 is also illustrated in the back view of the display module 100 as illustrated in FIG. 10.

For example, as illustrated in FIG. 10, the third flexible circuit board 160 is located on the side, away from the touch sensor 120, of the display substrate 110; the third flexible circuit board 160 and the fourth flexible circuit board 150 (for example, the main body 152 of the fourth flexible circuit board 150) are bonded and electrically connected to each other; for example, the third flexible circuit board 160 may control the drive chip 153 through the fourth flexible circuit board 150 (e.g., the main body 152 of the fourth flexible circuit board 150), and control the display substrate 110 through the drive chip 153 to realize the display function.

For example, as illustrated in FIG. 10, the first flexible circuit board 130 and the third flexible circuit board 160 are bonded with each other, so as to allow the first flexible circuit board 130 and the third flexible circuit board 160 to be electrically connected to each other; for example, the third flexible circuit board 160 can control the touch detection chip through the first flexible circuit board 130, and control the touch sensor 120 through the touch detection chip to realize the touch function.

For example, as illustrated in FIG. 10, the first flexible circuit board 130 at least partially overlap with the third flexible circuit board 160 in a direction perpendicular to the flat region 111 of the display substrate 110. For example, as illustrated in FIG. 10, the first flexible circuit board 130 further comprises an electrical connection region 134 protruding from the main body 131, and the electrical connection region 134 of the first flexible circuit board 130 is located on the side of the main body 131 away from the first bonding connection portion 132 and the second bonding connection portion 133. The electrical connection region 134 of the first flexible circuit board 130 and the third flexible circuit board 160 are at least partially overlapped with each other in the direction perpendicular to the flat region 111 of the display substrate 110 (i.e., the third direction), so that the first flexible circuit board 130 can be bonded with the third flexible circuit board 160 through the electrical connection region 134, so as to allow the first flexible circuit board 130 and the third flexible circuit board 160 to be electrically connected with each other.

For example, as illustrated in FIG. 10, the third flexible circuit board 160 comprises a main body 161, a connection portion 162 protruding from the main body 161 of the third flexible circuit board 160, and a connection terminal 163 connected with the connection portion 162 of the third flexible circuit board 160. For example, the electrical connection region 134 of the first flexible circuit board 130 at least partially overlaps with the main body 161 of the third flexible circuit board 160 in the direction perpendicular to the flat region 111 of the display substrate 110. For example, the connection terminal 163 of the third flexible circuit board 160 is configured to be connected to a main board (not shown in the figure) of the display device to receive image signals provided by the main board and the like.

For example, as illustrated in FIG. 10, the main body 131 of the first flexible circuit board 130, the main body 152 of the fourth flexible circuit board 150, the drive chip 153, and the main body 161 of the third flexible circuit board 160 are all disposed in the flat region of the display module 100. This is because the materials of the main body 131 of the first flexible circuit board 130, the main body 152 of the fourth flexible circuit board 150, the drive chip 153 and the main body 161 of the third flexible circuit board 160 are hard. Disposing the main body 131 of the first flexible circuit board 130, the main body 152 of the fourth flexible circuit board 150, the drive chip 153 and the main body 161 of the third flexible circuit board 160 in the flat region can avoid defects caused by bending the main body 131 of the first flexible circuit board 130, the main body 152 of the fourth flexible circuit board 150, the drive chip 153 and the main body 161 of the third flexible circuit board 160.

For example, as illustrated in FIG. 10, an orthographic projection of the drive chip 153 on the display substrate 110 is in a region surrounded by an orthographic projection of the first bonding connection portion 132 of the first flexible circuit board 130 on the display substrate 110, an orthographic projection of the second bonding connection portion 133 of the first flexible circuit board 130 on the display substrate 110 and an orthographic projection of the main body 131 of the first flexible circuit board 130 on the display substrate 110, and the orthographic projection of the drive chip 153 on the display substrate 110 is spaced apart from the orthographic projection of the first bonding connection portion 132 of the first flexible circuit board 130 on the display substrate 110, the orthographic projection of the second bonding connection portion 133 of the first flexible circuit board 130 on the display substrate 110 and the orthographic projection of the main body 131 of the first flexible circuit board 130 on the display substrate 110, such that defects caused by that the drive chip 153 is covered by the first flexible circuit board 130 can be avoided.

For example, as illustrated in FIG. 10, the first bonding connection portion 132 and the second bonding connection portion 133 are respectively on two sides of the drive chip 153 in the first direction D1. For example, as illustrated in FIG. 10, the first bonding connection portion 132, the second bonding connection portion 133, and the main body 131 of the first flexible circuit board 130 form an opening, and the opening exposes the drive chip 153, thereby avoiding defects caused by that the drive chip 153 is covered by the first flexible circuit board 130.

For example, as illustrated in FIG. 10, the main body 131 of the first flexible circuit board 130 is located on a side, away from the display substrate 110, of the third flexible circuit board 160 (e.g., the main body 161 of the third flexible circuit board 160). For example, as illustrated in FIG. 10, the main body 161 of the third flexible circuit board 160, the main body 152 of the fourth flexible circuit board 150 and the main body of the first flexible circuit board 130 are sequentially disposed on the side, away from the touch sensor 120, of the display substrate 110, and the main body 161 of the third flexible circuit board 160 is closer to the display substrate 110 than the main body of the first flexible circuit board 130.

It should be noted that the positional relationship of the main body 161 of the third flexible circuit board 160, the main body 152 of the fourth flexible circuit board 150 and the main body of the first flexible circuit board 130 in the direction perpendicular to the flat region 111 of the display substrate 110 is not limited to the example as illustrated in FIG. 10. In an example, the main body 152 of the fourth flexible circuit board 150, the main body 131 of the first flexible circuit board 130 and the main body 161 of the third flexible circuit board 160 are sequentially disposed on the side, away from the touch sensor 120, of the display substrate 110, and the main body 152 of the fourth flexible circuit board 150 is closer to the display substrate 110 than the main body 161 of the third flexible circuit board 160. In another example, the main body 152 of the fourth flexible circuit board 150, the main body 161 of the third flexible circuit board 160 and the main body 131 of the first flexible circuit board 130 are sequentially disposed on the side, away from the touch sensor 120, of the display substrate 110, and the main body 152 of the fourth flexible circuit board 150 is closer to the display substrate 110 than the main body 131 of the first flexible circuit board 130.

Figure 11:
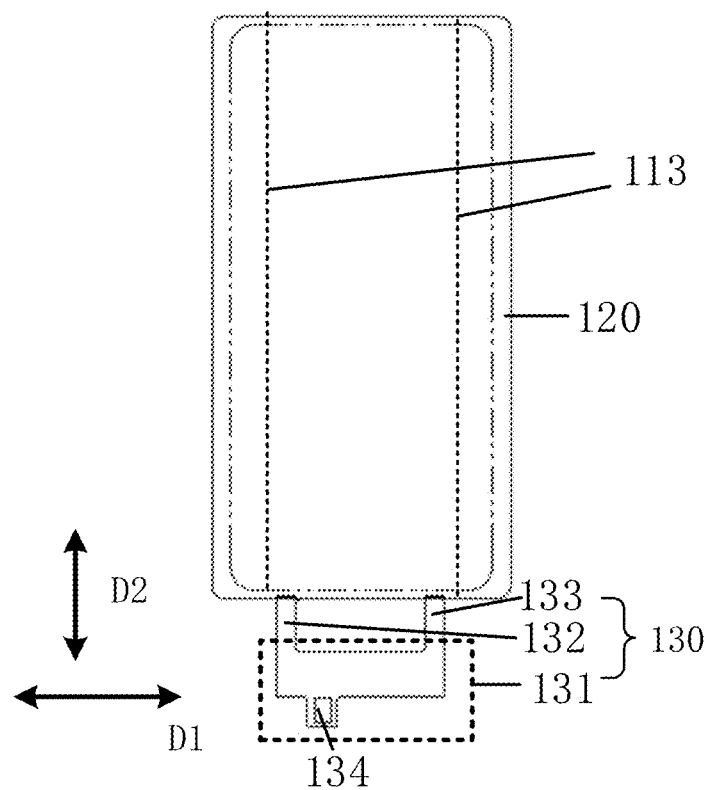
FIG. 11 is a front view of a touch sensor and a first flexible circuit board of another display module provided by at least one embodiment of the present disclosure.
Figure 12:
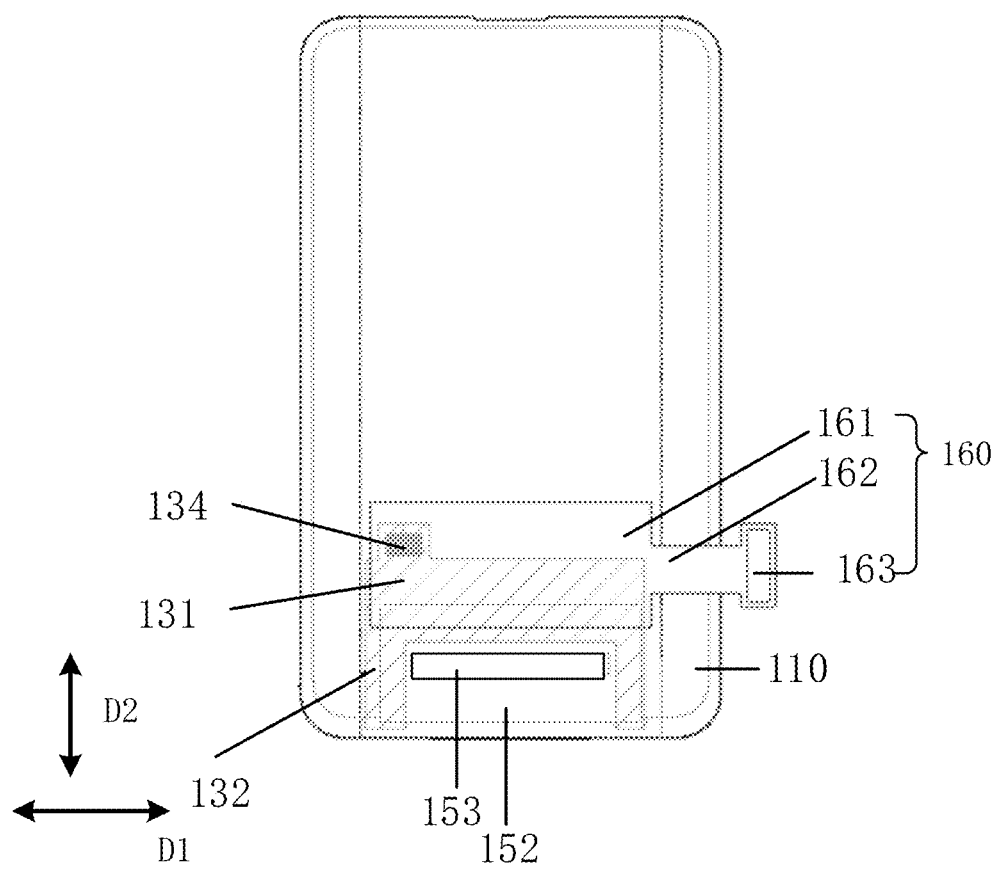
FIG. 12 is a back view of the display module as illustrated in FIG. 11.

It should be noted that the shapes, connections, and arrangements of the first flexible circuit board 130, the fourth flexible circuit board 150 and the third flexible circuit board 160 as illustrated in FIG. 5 and FIG. 10 are only examples, and embodiments of the present disclosure are not limited thereto. FIG. 11 is a front view of the touch sensor 120 and the first flexible circuit board 130 of another display module 100 provided by at least one embodiment of the present disclosure, and FIG. 12 is a back view of the display module 100 as illustrated in FIG. 11. For example, the shapes, connections and arrangements of the first flexible circuit board 130, the fourth flexible circuit board 150 (the main body 152 and the drive chip 153 of the fourth flexible circuit board 150) and the third flexible circuit board 160 may adopt the example as illustrated in FIG. 11 and FIG. 12.

Referring to FIG. 8 and FIG. 9 again, for example, the display module 100 further comprises a bonding support structure 141; the bonding support structure 141 overlaps with the first bonding connection portion 132 and the second bonding connection portion 133 in the direction perpendicular to the flat region 111 of the display substrate 110, and the bonding support structure 141 is located at the side of the portion, which is in contact with the touch sensor 120, of the first bonding connection portion 132 of the first flexible circuit board 130 away from the touch sensor 120. For example, by providing the bonding support structure 141, it is possible to prevent the end of the first bonding connection portion 132 (i.e., the portion, which is in contact with the touch sensor 120, of the first bonding connection portion 132) and the end of the second bonding connection portion 133 (i.e., the portion, which is in contact with the touch sensor 120, of the second bonding connection portion 133) from tilting up when the first flexible circuit board 130 is bent, such that invalid bonding caused by that the end of the first bonding connection portion 132 and the end of the second bonding connection portion 133 are tilting up can be prevented, and the robustness and the reliability of the bonding and connection between the touch sensor 120 and the first flexible circuit board 130 can be improved.

For example, the material of the bonding support structure 141 can be determined according to actual application requirements, which is not specifically limited by the embodiments of the present disclosure. For example, the bonding support structure 141 may be a foam layer or a polyethylene terephthalate layer, and in this case, the bonding support structure 141 can not only improve the robustness and the reliability of the bonding and connection between the touch sensor 120 and the first flexible circuit board 130, but also prevent the end of the first bonding connection portion 132 and the end of the second bonding connection portion 133 from reflecting light, thereby avoiding the deterioration of the display effect of the display module 100.

For example, the bonding support structure 141 may comprise a first bonding support structure and a second bonding support structure that are spaced apart from each other in the first direction, and the first bonding support structure and the second bonding support structure are respectively stacked with the end of the first bonding connection portion 132 and the end of the second bonding connection portion 133. For another example, the bonding support structure 141 may be not only stacked with the end of the first bonding connection portion 132 and the end of the second bonding connection portion 133, but also be stacked with the gap between the end of the first bonding connection portion 132 and the end of the second bonding connection portion 133.

For example, as illustrated in FIG. 8 and FIG. 9, the display module 100 further comprises a cover plate 142. The cover plate 142 is located on the display side of the display substrate 110 and on the side, away from the display substrate 110, of the touch sensor 120. For example, the cover plate 142 is configured to protect related films of the display module 100 from being scratched. For example, the cover plate 142 may be a transparent substrate. For example, the transparent substrate may be a glass substrate, a quartz substrate, a plastic substrate (such as a polyethylene terephthalate (PET) substrate), or a substrate made of other suitable materials. For example, the portion, located in the curved surface region, of the cover plate 142 of the display module 100 has a certain bending curvature, so that the portions, located in the curved surface region of the display module 100, of the display substrate 110 and of the touch sensor 120 can be bent along the bending curvature of the cover plate 142.

For example, as illustrated in FIG. 8 and FIG. 9, the bonding support structure 141 is sandwiched between the first flexible circuit board 130 and the cover plate 142; in this case, the cover plate 142 not only has the function of protecting the related films of the display module 100 from being scratched, but also applies downward force to the end of the first bonding connection portion 132 and the end of the second bonding connection portion 133 through the bonding support structure 141, thereby further improving the robustness and reliability of the bonding and connection between the touch sensor 120 and the first flexible circuit board 130. For example, as illustrated in FIG. 8 and FIG. 9, the bonding support structure 141 is in direct contact with both the first flexible circuit board 130 and the cover plate 142.

For example, the display module 100 further comprises a polarizer 143. For example, the polarizer 143 is a circular polarizer. For example, the polarizer 143 is located between the touch sensor 120 and the cover plate 142. For example, the polarizer 143 (e.g., a circular polarizer) can alleviate the problems of poor contrast and poor display quality caused by reflected light (which is caused by the reflection of ambient light by the display substrate).

For example, the display module 100 further comprises adhesive layers 144 which are disposed between the polarizer 143 and the cover plate 142 and between the touch sensor 120 and the display substrate 110. The adhesive layer 144 may be, for example, optical adhesive. For example, the optical adhesive 144 may be an optically clear adhesive (OCA).

For example, the sum of the thicknesses of the bonding support structure 141 and the thicknesses of the first bonding connection portion 132 in the direction perpendicular to the flat region 111 of the display substrate 110 is substantially equal to the value of the distance between the touch sensor 120 and the cover plate 142 in the direction perpendicular to the flat region 111 of the display substrate 110. In this case, the bonding support structure 141 can be in direct contact with both the first flexible circuit board 130 and the cover plate 142, so that the cover plate 142 can apply downward forces to the end of the first bonding connection portion 132 and the end of the second bonding connection portion 133 through the bonding support structure 141, so as to further improve the robustness and reliability of the bonding and connection between the touch sensor 120 and the first flexible circuit board 130.

For example, the sum of the thicknesses of the bonding support structure 141 and the thicknesses of the first bonding connection portion 132 in the direction perpendicular to the flat region 111 of the display substrate 110 is substantially equal to the sum of the thicknesses of the polarizer 143 and the thicknesses of the adhesive layer 144 (the adhesive layer 144 between the cover plate 142 and the polarizer 143) in the direction perpendicular to the flat region 111 of the display substrate 110.

Figure 13:
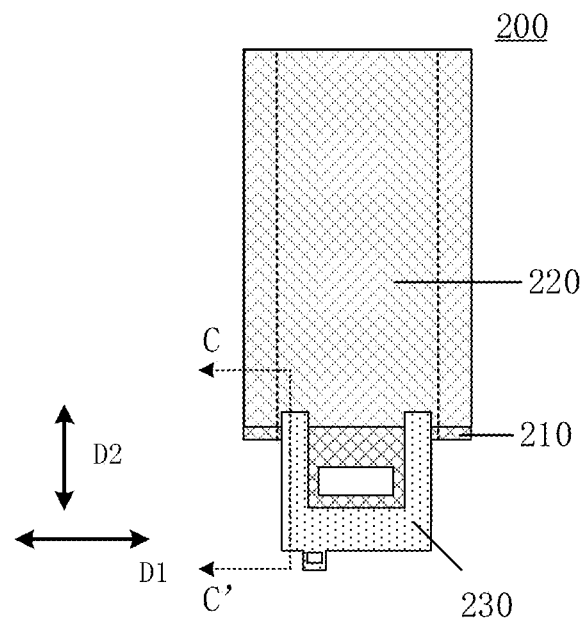
FIG. 13 is a front view of further another display module provided by at least one embodiment of the present disclosure.

FIG. 13 is a front view of another display module 200 provided by at least one embodiment of the present disclosure. For example, the display module 200 may be an active matrix organic light emitting diode display screen. As illustrated in FIG. 13, the display module 200 comprises a display substrate 210 (for example, an organic light emitting diode display panel) and a touch sensor 220 disposed on the display side of the display substrate 210. As illustrated in FIG. 13, the display module 200 further comprises a first flexible circuit board 230 (i.e., a circuit board of the touch sensor 220). It should be noted that, in FIG. 13, the first flexible circuit board 230 of the display module 200 is not in a bending state, and the fold portion of the display substrate 210 is not in a fold state.

Figure 14A:
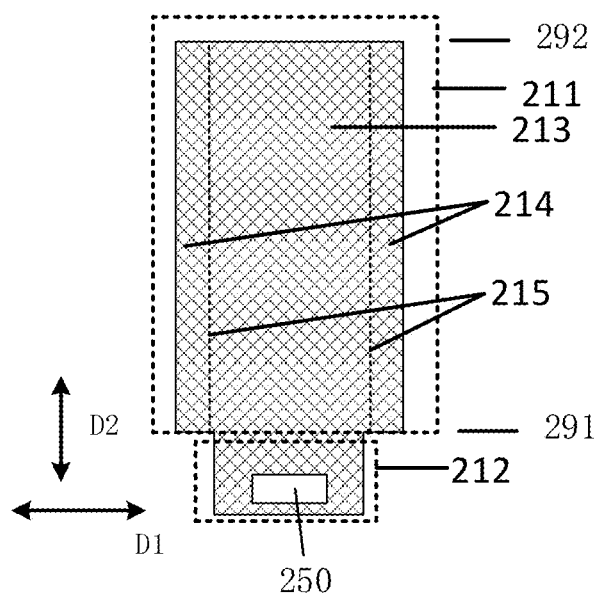
FIG. 14A is a front view of a display substrate and a drive chip of the display module as illustrated in FIG. 13.

FIG. 14A is a front view of the display substrate 210 and the drive chip 250 of the display module 200 as illustrated in FIG. 13. As illustrated in FIG. 14A, the second direction D2 has a first side 291 and a second side 292. For example, the first side 291 and the second side 292 of the second direction D2 are used to illustrate two sides in the second direction D2 of the display module 200 and illustrate two sides in the second direction D2 of the components of the display module 200. For example, the first side 291 of the second direction D2 and the second side 292 of the second direction D2 are used to respectively represent the first side of the touch sensor 220 and the second side of the touch sensor 220 in the second direction D2. For another example, the first side 291 of the second direction D2 and the second side 292 of the second direction D2 may be used to respectively represent the first side of the substrate main body 211 in the second direction D2 and the second side of the substrate main body 211 in the second direction D2.

As illustrated in FIG. 14A, the display substrate 210 comprises a substrate body 211, and a fold portion 212 protruding from the substrate body 211 at a first side 291 (the first side of the substrate body 211). For example, the display substrate 210 further comprises a bent portion (not labeled in the figure) arranged between the substrate body 211 of the display substrate 210 and the fold portion 212 of the display substrate 210, and opposite sides of the bent portion are respectively connected with the substrate body 211 and the fold portion 212 of the display substrate 210. For example, in the final product of the display module 200, the bent portion of the display substrate 210 is bent, and the fold portion 212 of the display substrate 210 is provided at the side, away from the touch sensor 220, of the substrate main body 211 through bending, that is, in the final product of the display module 200, the display substrate 210 is in a fold state.

For example, the bent portion of the display substrate 210 is configured to allow the substrate main body 211 and the fold portion 212 to be parallel to each other and to be stacked with each other in the direction perpendicular to the substrate main body 211. For example, both the fold portion 212 and the bent portion of the display substrate 210 are located in the peripheral region of the display substrate 210, and the display region of the display substrate 210 is located in the substrate body 211 of the display substrate 210. For example, by providing the bent portion and the fold portion 212, the area of the peripheral region in the plane where the substrate main body 211 is located can be reduced, which is beneficial to the narrow frame design of the display module 200.

As illustrated in FIG. 14A, the substrate body 211 comprises a flat region 213 and a curved surface region 214, and a virtual boundary line (can also be referred to as a bending start line 215) is between the flat region 213 and the curved surface region 214. It should be noted that the flat region 213, the curved surface region 214 and the bending start line 215 of the display substrate 210 respectively correspond to the flat region, the curved surface region, and the bending start line of the display module 200.

Figure 17:
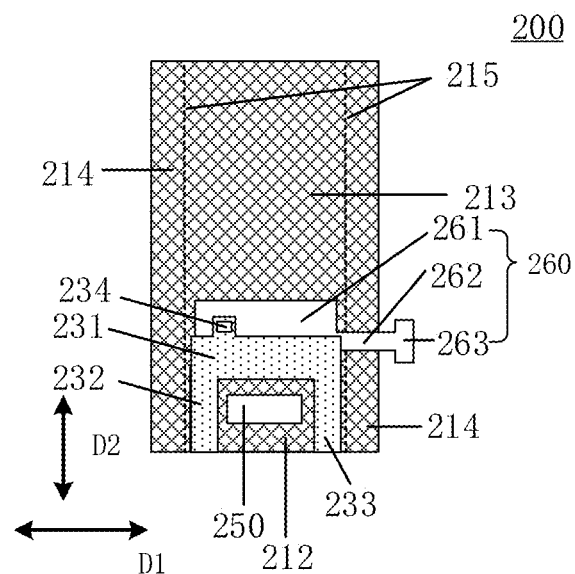
FIG. 17 is a back view of the display module as illustrated in FIG. 13.

For example, as illustrated in FIG. 14A and FIG. 17, the display module 200 further comprises a drive chip 250 located on the side, away from the touch sensor 220, of the display substrate 210. For example, the drive chip 250 comprises a data driver, a gate driver, a timing controller T-Con, and the like. As illustrated in FIG. 14A, the drive chip 250 is located on a side, away from the touch sensor 220 (the side away from the substrate main body 211), of the fold portion 212, and the drive chip 250 is directly bonded (for example, directly formed) on the fold portion 212, such that the drive chip 250 is electrically connected with the display substrate 210. For example, by directly bonding (e.g., directly forming and directly integrating) the drive chip 250 on the fold portion 212, the electrical connection between the drive chip 250 and the display substrate 210 can be realized without a flexible circuit board, and thus the structure of the display module 200 is simplified.

Figure 14B:
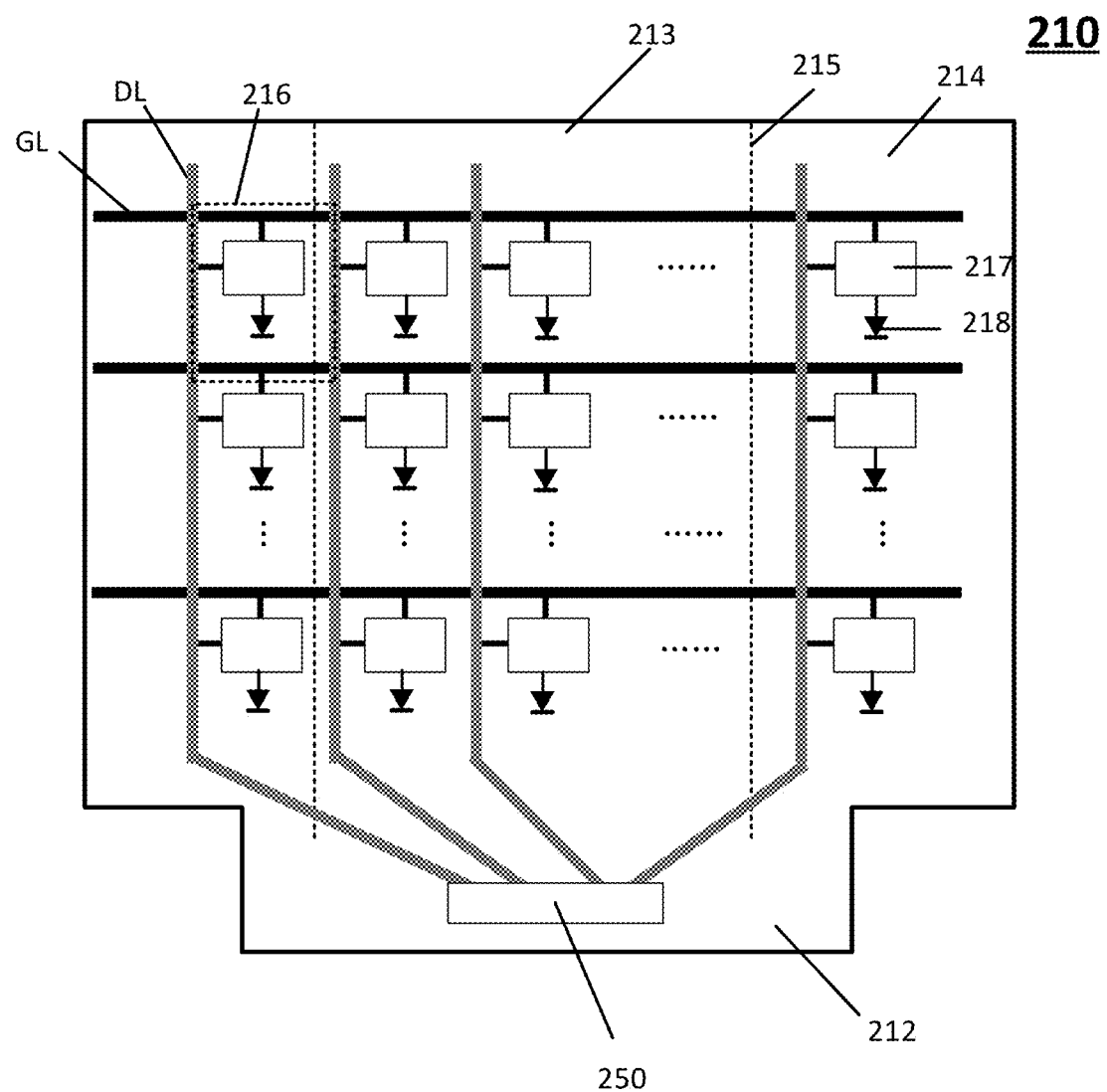
FIG. 14B is an example of the display substrate and the drive chip illustrated in FIG. 14A.

FIG. 14B is an example of the display substrate 210 and the drive chip 250 as illustrated in FIG. 14A. For example, as illustrated in FIG. 6B, the display substrate 210 comprises a plurality of gate lines GL and a plurality of data lines DL, the plurality of gate lines GL intersect with the plurality of data lines DL to define a plurality of display pixel units 216 arranged in an array; each of the plurality of display pixel units 216 comprises a pixel drive circuit 217 and a light emitting component 218 connected with the pixel drive circuit 217. For example, as illustrated in FIG. 6B, the plurality of data lines DL of the display substrate 210 are directly bonded with the drive chip 250, so as to allow the plurality of data lines DL and the drive chip 250 to be electrically connected with each other, and the data driver of the drive chip 250 can provide data signals for display to the pixel drive circuit 217 through the data lines DL, and the gate driver of the drive chip 250 can provide gate scanning signals for display to the pixel drive circuit 217 through the gate lines GL, so that the drive chip 250 can drive the display substrate 210 to realize a display function. For example, the drive chip 250 is directly formed on the fold portion 212, and the drive chip 250 is electrically connected with the plurality of data lines DL extending into the fold portion 212. For example, the drive chip 250 may also be electrically connected with the plurality of gate lines GL. For example, other descriptions of the display pixel units 216, the gate lines GL, the data lines DL and the drive chip 250 as illustrated in FIG. 14B may be referred to the example as illustrated in FIG. 6B, and are not be repeated here.

Figure 14C:
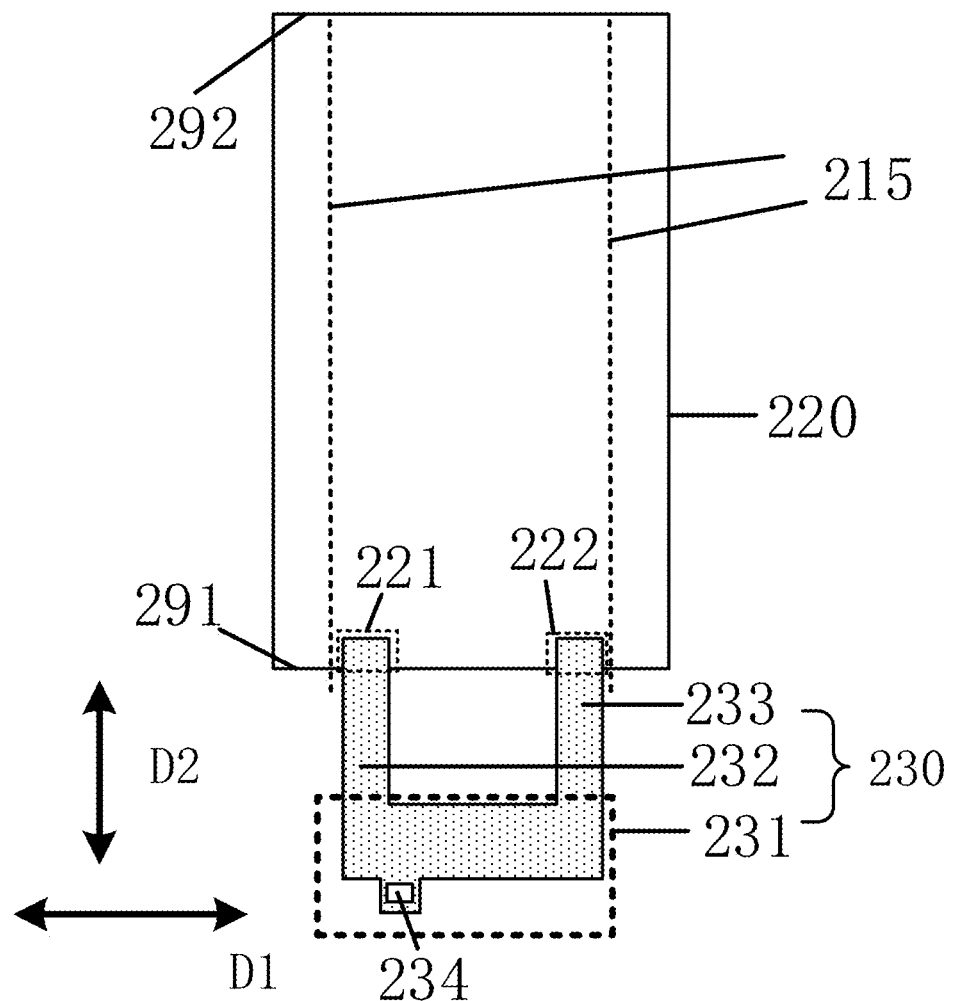
FIG. 14C is a front view of a touch sensor and a first flexible circuit board of the display module as illustrated in FIG. 13.

FIG. 14C is a front view of the touch sensor 220 and the first flexible circuit board 230 of the display module 200 as illustrated in FIG. 13. It should be noted that, for convenience of description, FIG. 14C also shows a bending start line 215 of the display substrate 210; It can be understood that the portion, which is located on two sides of the bending start lines 215, of the touch sensor 220 are in a bending state in the final product of the display module 200. It should be noted that the first flexible circuit board 230 as illustrated in FIG. 14C is not in a bending state.

As illustrated in FIG. 13 and FIG. 14C, the touch sensor 220 has a first bonding region 221 and a second bonding region 222 on the first side 291 of the second direction D2. The first bonding region 221 and the second bonding region 222 are stacked with the flat region 213 and are spaced apart from each other in the first direction D1, that is, an orthographic projection of the first bonding region 221 on the display substrate 210 and an orthographic projection of the second bonding region 222 on the display substrate 210 are only in the flat region 213. For example, neither the first bonding region 221 nor the second bonding region 222 overlaps with the curved surface region 214.

For example, by making the touch sensor 220 have the first bonding region 221 and the second bonding region 222 at the first side 291 of the second direction D2 intersecting with the first direction D1, the first bonding region 221 and the second bonding region 222 are on a surface of the touch sensor 220 on a side, away from the display substrate 210, of the touch sensor 220, the first bonding region 221 and the second bonding region 222 are stacked with the flat region 213 and are spaced apart from each other, and the first flexible circuit board 230 is electrically connected with the touch sensor 220 through the first bonding region 221 and the second bonding region 222, so that the space on the back of the display module 200 is effectively utilized, and the size of the wiring region available for the first flexible circuit board 230 (the overall width of the wiring region available for the first flexible circuit board 230 in the first direction D1) is increased, and the bonding and connection between the first flexible circuit board 230 and the touch sensor 220 can be realized in the case where the display module 200 comprises curved surface regions and the position of the drive chip 250 in the first direction D1 is not changed, and so that the potential electrical unevenness and brightness unevenness of the display substrate 210 along the first direction D1 caused by changing the position of the drive chip 250 in the first direction D1 can be avoided.

For example, as illustrated in FIG. 14C, the first flexible circuit board 230 comprises a main body 231, and a first bonding connection portion 232 and a second bonding connection portion 233 that are protruded from the main body 231 of the first flexible circuit board 230 and are spaced apart from each other. The first bonding connection portion 232 is bonded with the first bonding region 221 (e.g., wires in the first bonding region 221), so as to allow the first bonding connection portion 232 and the first bonding region 221 to be electrically connected with the first bonding region 221, and the second bonding connection portion 233 is bonded with the second bonding region 222 (e.g., wires in the second bonding region 222), so as to allow the second bonding connection portion 233 and the second bonding region 222 to be electrically connected with each other. For example, the specific implementation of the touch sensor 220 and the first flexible circuit board 230 as illustrated in FIG. 14C may be referred to the examples as illustrated in FIG. 7A and FIG. 7B, and are not be described in detail here.

Figure 15:
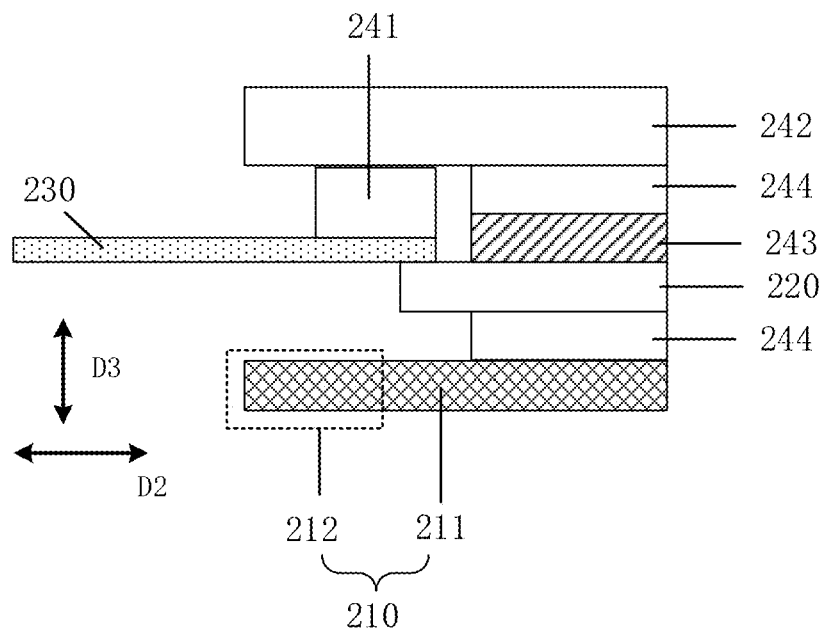
FIG. 15 is a cross-sectional schematic diagram of the display module as illustrated in FIG. 13.

FIG. 15 is a schematic cross-sectional view of the display module 200 as illustrated in FIG. 13, and the schematic cross-sectional view as illustrated in FIG. 15 is taken along the line CC' in FIG. 13. In FIG. 6, the first flexible circuit board 230 of the display module 200 and the bent portion of the display substrate 210 are not in a bending state. As illustrated in FIG. 8, the touch sensor 220 is stacked with the display substrate 210 in the third direction D3, and the touch sensor 220 is on the display side (i.e., the light emitting side or the image output side) of the display substrate 210 in the third direction D3. For example, the first direction D1, the second direction D2 and the third direction D3 intersects with each other (e.g., perpendicular to each other).

Figure 16:
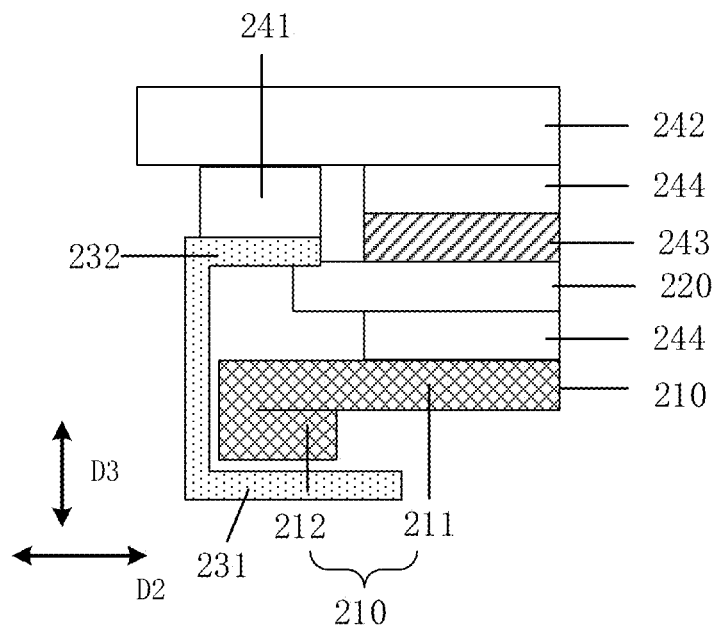
FIG. 16 is another cross-sectional schematic diagram of the display module as illustrated in FIG. 13.

FIG. 16 is another schematic cross-sectional view of the display module 200 as illustrated in FIG. 13. Compared with the schematic cross-sectional view illustrated in FIG. 15, in the schematic cross-sectional view illustrated in FIG. 16, both the first flexible circuit board 230 and the bent portion of the display substrate 210 are in a bending state. As illustrated in FIG. 16, the fold portion 212 of the display substrate 210 and a portion of the first flexible circuit board 230 (the main body 231, part of the first bonding connection portion 232 and part of the second bonding connection portion 233 of the first flexible circuit board 230) are all provided at the back of the display substrate 210 (that is, the side, away from the touch sensor 220, of the display substrate 210) through bending.

As illustrated in FIG. 15 and FIG. 16, the display module 200 further comprises a bonding support structure 241, a cover plate 242, a polarizer 243 and an adhesive layer 244. For example, specific implementations of the bonding support structure 241, the cover plate 242, the polarizer 243 and the optical adhesive 244 may be referred to the bonding support structure 141, the cover plate 142, the polarizer 143 and the adhesive layer 144 as illustrated in FIG. 8 and FIG. 9, and are not described in detail here.

FIG. 17 is a back view of the display module 200 as illustrated in FIG. 13. For example, the display module 200 further comprises a third flexible circuit board 260 (that is, the main circuit board of the display module 200); for convenience of description, the third flexible circuit board 260 is also illustrated in the back view in FIG. 17.

As illustrated in FIG. 17, the third flexible circuit board 260 is on a side, away from the touch sensor 220, of the substrate body 211 of the display substrate 210. The first flexible circuit board 230 and the third flexible circuit board 260 are bonded with each other, so as to be electrically connected to each other by. For example, as illustrated in FIG. 17, the first flexible circuit board 230 at least partially overlaps with the third flexible circuit board 260 in a direction perpendicular to the flat region 213 of the display substrate 210. For example, as illustrated in FIG. 17, the first flexible circuit board 230 further comprises an electrical connection region 234 protruding from the main body 231 of the first flexible circuit board 230, and the electrical connection region 234 of the first flexible circuit board 230 is on a side, away from the first bonding connection portion 232 and the second bonding connection portion 233, of the main body 231. The electrical connection region 234 of the first flexible circuit board 230 at least partially overlaps with the third flexible circuit board 260 in the direction perpendicular to the flat region 213 of the display substrate 210, so that the first flexible circuit board 230 is bonded with the third flexible circuit board 260 through the electrical connection region 234, so as to allow the first flexible circuit board 230 and the third flexible circuit board 260 to be electrically connected with the third flexible circuit board 260. For example, the first flexible circuit board 230 further comprises a touch detection chip, and the third flexible circuit board 260 can control the touch detection chip through the first flexible circuit board 230 and thus control the touch sensor 220 through the touch detection chip to realize the touch function.

For example, the third flexible circuit board 260 is further bonded with the drive chip 250, so as to allow the third flexible circuit board 260 and the drive chip 250 to be electrically connected with each other, so that the third flexible circuit board 260 can control the display substrate 210 to realize the display function through the drive chip 250.

For example, as illustrated in FIG. 17, the third flexible circuit board 260 includes a main body 261, a connection portion 262 protruding from the main body 261 of the third flexible circuit board 260, and a connection terminal 263 connected with the connection portion 262 of the third flexible circuit board 260. For example, the connection terminal 263 of the third flexible circuit board 260 is configured to be connected with the main board to receive an image signal provided by the main board and the like. For example, as illustrated in FIG. 7, the main body 231 of the first flexible circuit board 230, the substrate main body 211, the drive chip 250, and the main body 261 of the third flexible circuit board 260 are all disposed in the flat region of the display module 200.

For example, as illustrated in FIG. 17, an orthographic projection of the drive chip 250 on the flat region 213 of the display substrate 210 is in a region surrounded by an orthographic projection of the first bonding connection portion 232 of the first flexible circuit board 230 on the flat region 213 of the display substrate 210, an orthographic projection of the second bonding connection portion 233 of the first flexible circuit board 230 on the flat region 213 of the display substrate 210 and an orthographic projection of the main body 231 of the first flexible circuit board 230 on the flat region 213 of the display substrate 210, and the orthographic projection of the drive chip 250 on the flat region 213 of the display substrate 210 is spaced apart from all of the orthographic projection of the first bonding connection portion 232 of the first flexible circuit board 230 on the flat region 213 of the display substrate 210, the orthographic projection of the second bonding connection portion 233 of the first flexible circuit board 230 on the flat region 213 of the display substrate 210 and the orthographic projection of the main body 231 of the first flexible circuit board 230 on the flat region 213 of the display substrate 210, thereby avoiding defects caused by that the drive chip 250 is covered by the first flexible circuit board 230.

For example, as illustrated in FIG. 17, the first bonding connection portion 232, the second bonding connection portion 233, and the main body 231 of the first flexible circuit board 230 form an opening, and the opening exposes the drive chip 250, thereby avoiding defects caused by that the drive chip 250 is covered by the first flexible circuit board 230.

For example, as illustrated in FIG. 17, the main body 261 of the third flexible circuit board 260, the fold portion 212 of the display substrate 210 and the main body 231 of the first flexible circuit board 230 are sequentially disposed on the side, away from the touch sensor 220, of the substrate main body 211 of the display substrate 210, and the main body 261 of the third flexible circuit board 260 is closer to the substrate main body 211 of the display substrate 210 than the main body 231 of the first flexible circuit board 230.

It should be noted that the positional relationship of the main body 261 of the third flexible circuit board 260, the fold portion 212 of the display substrate 210 and the main body 231 of the first flexible circuit board 230 in the direction perpendicular to the flat region 231 of the display substrate 210 is not limited to the example as illustrated in FIG. 17. In an example, the fold portion 212 of the display substrate 210, the main body 231 of the first flexible circuit board 230 and the main body 261 of the third flexible circuit board 260 are sequentially disposed on the side, away from the touch sensor 220, of the substrate main body 211 of the display substrate 210, and the fold portion 212 of the display substrate 210 is closer to the substrate main body 211 of the display substrate 210 than the main body 261 of the third flexible circuit board 260. In another example, the fold portion 212 of the display substrate 210, the main body 261 of the third flexible circuit board 260 and the main body 231 of the first flexible circuit board 230 are sequentially disposed on the side, away from the touch sensor 220, of the substrate main body 211 of the display substrate 210, and the fold portion 212 of the display substrate 210 is closer to the substrate main body 211 of the display substrate 210 than the main body 231 of the first flexible circuit board 230.

It should be noted that the drive chip 250 of the display module 200 as illustrated in FIG. 17 is not limited to being directly bonded on the substrate main body 211, and in some examples, the drive chip 250 may also be bonded on the substrate main body 211 through a flexible circuit board. The following is an exemplary description with reference to FIG. 18A, FIG. 18B and FIG. 19.

Figure 18A:
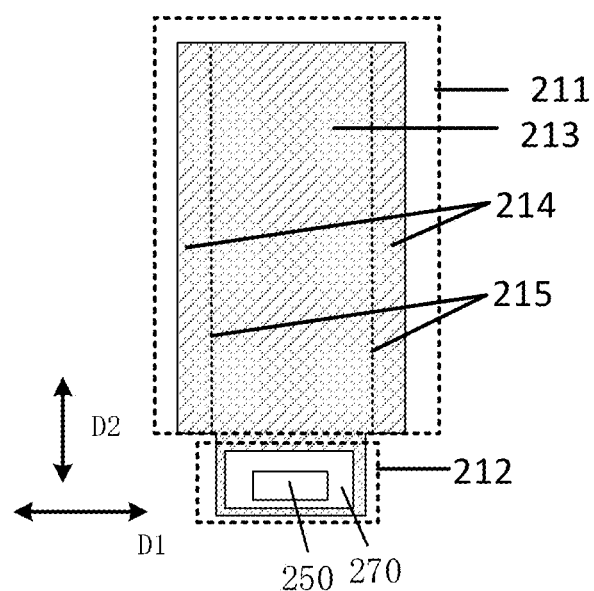
FIG. 18A is a front view of a display substrate and a second flexible circuit board of still another display module provided by at least one embodiment of the present disclosure.

FIG. 18A is a front view of the display substrate 210 and a second flexible circuit board 270 of still another display module 200 provided by at least one embodiment of the present disclosure. The display module 200 as illustrated in FIG. 18A is similar to the display module 200 as illustrated in FIG. 13, so only the differences between them are described here, and the similarities are not be described again.

Figure 18B:
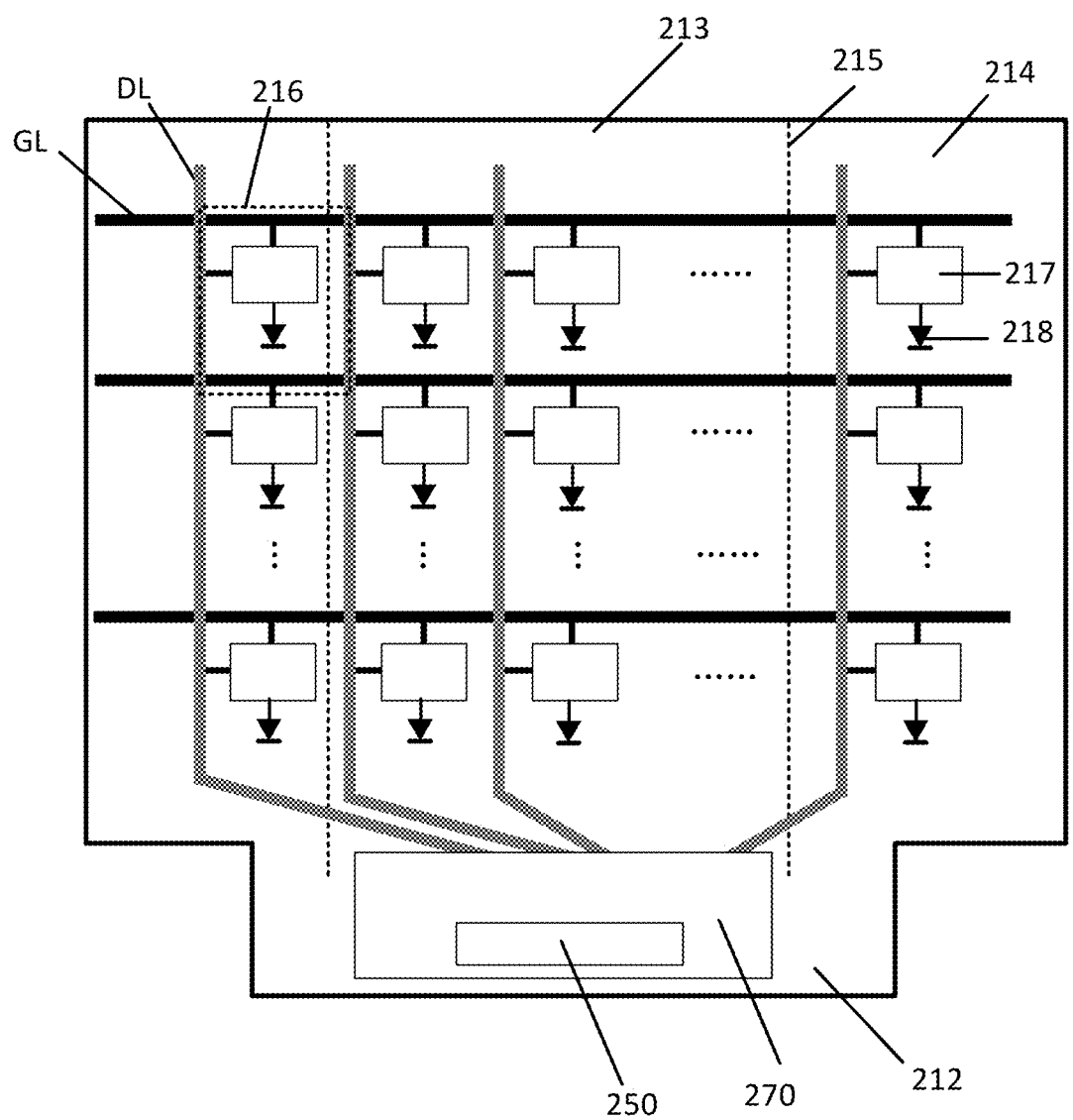
FIG. 18B is an example of the display substrate and the second flexible circuit board as illustrated in FIG. 18A.

As illustrated in FIG. 18A, the display module 200 further includes a second flexible circuit board 270, the second flexible circuit board 270 includes a drive chip 250; the second flexible circuit board 270 and the display substrate 210 are bonded and electrically connected with each other, thereby realizing the bonding and connection between the drive chip 250 and the display substrate 210. FIG. 18B is an example of the display substrate 210 and the second flexible circuit board 270 as illustrated in FIG. 18A. As illustrated in FIG. 18B, the second flexible circuit board 270 is bonded with the data lines DL of the display substrate 210, and thereby the drive chip 250 is electrically connected to the data lines DL of the display substrate 210 through the second flexible circuit board 270.

Figure 19:
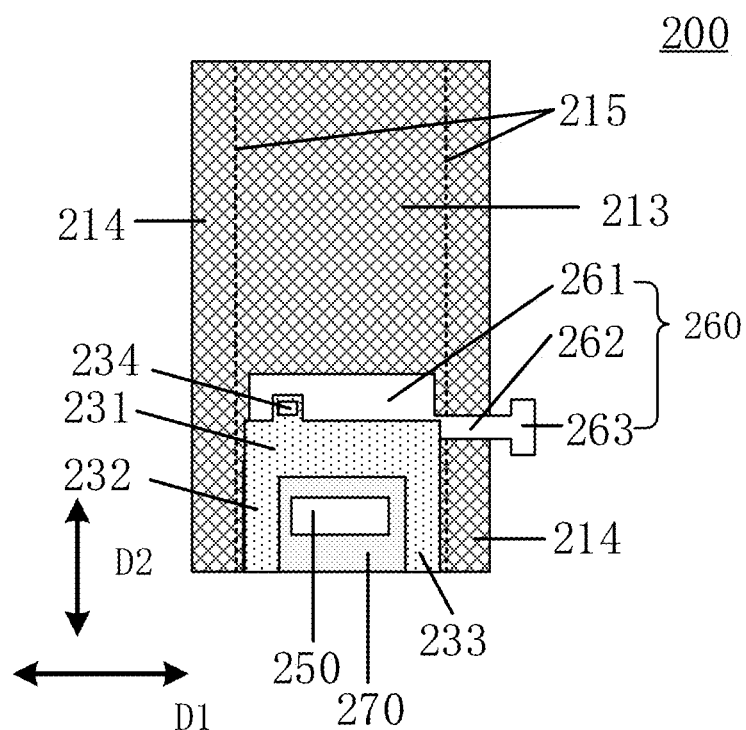
FIG. 19 is a back view of the display module as illustrated in FIG. 18A.

FIG. 19 is a back view of the display module 200 as illustrated in FIG. 18A. As illustrated in FIG. 19, the second flexible circuit board 270 is on a side, away from the substrate main body 211, of the fold portion 212 and is bonded with the fold portion 212, and the drive chip 250 is on a side, away from the fold portion 212, of the second flexible circuit board 270. As illustrated in FIG. 19, the display module 200 further includes a third flexible circuit board 260 located on a side, away from the touch sensor 220, of the substrate main body 211 of the display substrate 210. The third flexible circuit board 260 includes a main body 261, and the main body 261 of the third flexible circuit board 260 is bonded and electrically connected with the second flexible circuit board 270. Therefore, the third flexible circuit board 260 can drive the display substrate 210 through the drive chip 250.

For example, as illustrated in FIG. 19, an orthographic projection of the drive chip 250 on the flat region 213 of the display substrate 210 is in a region surrounded by an orthographic projection of the first bonding connection portion 232 of the first flexible circuit board 230 on the flat region 213 of the display substrate 210, an orthographic projection of the second bonding connection portion 233 of the first flexible circuit board 230 on the flat region 213 of the display substrate 210 and an orthographic projection of the main body 231 of the first flexible circuit board 230 on the flat region 213 of the display substrate 210, and the orthographic projection of the drive chip 250 on the flat region 213 of the display substrate 210 is spaced apart from all of the orthographic projection of the first bonding connection portion 232 of the first flexible circuit board 230 on the flat region 213 of the display substrate 210, the orthographic projection of the second bonding connection portion 233 of the first flexible circuit board 230 on the flat region 213 of the display substrate 210 and the orthographic projection of the main body 231 of the first flexible circuit board 230 on the flat region 213 of the display substrate 210, thereby avoiding defects caused by that the drive chip 250 is covered by the first flexible circuit board 230.

For example, as illustrated in FIG. 19, the main body 261 of the third flexible circuit board 260, the fold portion 212 of the display substrate 210, the second flexible circuit board 270, and the main body 231 of the first flexible circuit board 230 are sequentially disposed on the side, away from the touch sensor 220, of the substrate main body 211 of the display substrate 210, and the main body 261 of the third flexible circuit board 260 is closer to the substrate main body of the display substrate 210 than the main body 231 of the first flexible circuit board 230.

It should be noted that the positional relationship of the main body 261 of the third flexible circuit board 260, the fold portion 212 of the display substrate 210, the second flexible circuit board 270 and the main body 231 of the first flexible circuit board 230 in the direction perpendicular to the flat region 231 of the display substrate 210 is not limited to the example as illustrated in FIG. 19. In an example, the fold portion 212 of the display substrate 210, the second flexible circuit board 270, the main body 231 of the first flexible circuit board 230 and the main body 261 of the third flexible circuit board 260 are sequentially disposed on the side, away from the touch sensor 220, of the substrate main body 211 of the display substrate 210, and the fold portion 212 of the display substrate 210 is closer to the substrate main body 211 of the display substrate 210 than the main body 261 of the third flexible circuit board 260. In another example, the fold portion 212 of the display substrate 210, the second flexible circuit board 270, the main body 261 of the third flexible circuit board 260 and the main body 231 of the first flexible circuit board 230 are sequentially disposed on the side, away from the touch sensor 220, of the substrate main body 211 of the display substrate 210, and the fold portion 212 of the display substrate 210 is closer to the substrate main body 211 of the display substrate 210 than the main body 231 of the first flexible circuit board 230.

Figure 20:
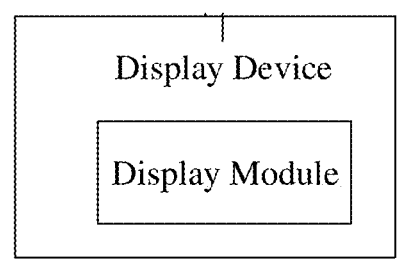
FIG. 20 is an exemplary block diagram of a display device provided by at least one embodiment of the present disclosure.

At least one embodiment of the present disclosure further provides a display device. FIG. 20 is an exemplary block diagram of a display device provided by at least one embodiment of the present disclosure. As illustrated in FIG. 20, the display device includes any one of the display modules provided by at least one embodiment of the present disclosure.

It should be noted that other components of the display module and the display device (for example, image data encoding/decoding device, clock circuit, etc.) may adopt suitable components, this should be understood by those skilled in the art, no further descriptions will be given here and it should not be construed as a limitation on the embodiments of the present disclosure.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What are described above is related to the illustrative embodiments of the disclosure only and not limitative to the scope of the disclosure; the scopes of the disclosure are defined by the accompanying claims.

What is claimed is:

1. A display module, comprising: a first flexible circuit board, a display substrate, and a touch sensor on a display side of the display substrate, wherein the display substrate comprises a flat region and curved surface regions respectively on two sides of the flat region in a first direction;

the touch sensor comprises a first bonding region and a second bonding region on a first side of a second direction intersecting with the first direction;

the first bonding region and the second bonding region are on a surface, away from the display substrate, of the touch sensor, and the first bonding region and the second bonding region are stacked with the flat region and are spaced apart from each other;

the first flexible circuit board is electrically connected with the touch sensor through the first bonding region and the second bonding region;

the first flexible circuit board comprises a main body, and a first bonding connection portion and a second bonding connection portion which protrude from the main body and are spaced apart from each other; and the first bonding connection portion is extended to the first bonding region so as to be electrically connected with the first bonding region, and the second bonding connection portion is extended to the second bonding region in the second direction so as to be electrically connected with the second bonding region;

the first bonding connection portion and the second bonding connection portion of the first flexible circuit board are bent, and the main body of the first flexible circuit board is on a side, away from the touch sensor, of the display substrate;

the display module further comprising: a drive chip on the side, away from the touch sensor, of the display substrate, wherein the drive chip is configured to drive the display substrate;

an orthographic projection of the drive chip on the flat region of the display substrate is in a region surrounded by an orthographic projection of the first bonding connection portion of the first flexible circuit board on the flat region of the display substrate, an orthographic projection of the second bonding connection portion of the first flexible circuit board on the flat region of the display substrate and an orthographic projection of the main body of the first flexible circuit board on the flat region of the display substrate; and the orthographic projection of the drive chip on the flat region of the display substrate is spaced apart from the orthographic projection of the first bonding connection portion of the first flexible circuit board on the flat region of the display substrate, the orthographic projection of the second bonding connection portion of the first flexible circuit board on the flat region of the display substrate and the orthographic projection of the main body of the first flexible circuit board on the flat region of the display substrate.

2. The display module according to claim 1, wherein the display substrate further comprises: a substrate main body and a fold portion protruding from the substrate main body on the first side;

the substrate main body comprises the flat region and the curved surface regions; and the fold portion is provided on a side, away from the touch sensor, of the substrate main body by bending.

3. The display module according to claim 2, wherein the drive chip is on a side, away from the touch sensor, of the fold portion, and the drive chip is bonded onto the fold portion.

4. The display module according to claim 3, further comprising a third flexible circuit board,
wherein the third flexible circuit board is on the side, away from the touch sensor, of the display substrate;
the first flexible circuit board and the third flexible circuit board are bonded so as to allow the first flexible circuit board and the third flexible circuit board to be electrically connected with each other; and
the third flexible circuit board and the drive chip are bonded so as to allow the third flexible circuit board and the drive chip to be electrically connected with each other.

5. The display module according to claim 2, wherein the display module further comprises a second flexible circuit board;
the second flexible circuit board is on a side, away from the substrate main body, of the fold portion and is bonded with the fold portion; and
the drive chip is on a side, away from the fold portion, of the second flexible circuit board.

6. The display module according to claim 2, further comprising a third flexible circuit board,
wherein the third flexible circuit board is on the side, away from the touch sensor, of the display substrate;
the first flexible circuit board and the third flexible circuit board are bonded so as to allow the first flexible circuit board and the third flexible circuit board to be electrically connected with each other; and
the third flexible circuit board and the second flexible circuit board are bonded so as to allow the third flexible circuit board and the second flexible circuit board to be electrically connected with each other.

7. The display module according to claim 2, further comprising a fourth flexible circuit board, wherein the fourth flexible circuit board comprises a third bonding connection portion;
the display substrate further comprises a third bonding region in the flat region;
the third bonding region is between an orthographic projection of the first bonding region on the flat region of the display substrate and an orthographic projection of the second bonding region on the flat region of the display substrate; and
the fourth flexible circuit board is bonded and electrically connected with the display substrate through the third bonding connection portion and the third bonding region.

8. The display module according to claim 1, further comprising a fourth flexible circuit board,
wherein the fourth flexible circuit board comprises a third bonding connection portion;
the display substrate further comprises a third bonding region in the flat region;
the third bonding region partially overlaps with an orthographic projection of the first bonding region on the flat region of the display substrate and an orthographic projection of the second bonding region on the flat region of the display substrate; and
the fourth flexible circuit board is bonded and electrically connected with the display substrate through the third bonding connection portion and the third bonding region.

9. The display module according to claim 8, wherein the fourth flexible circuit board further comprises a main body connected with the third bonding connection portion; and
the third bonding connection portion of the fourth flexible circuit board is bent, and the main body of the fourth flexible circuit board is on the side, away from the touch sensor, of the display substrate.

10. The display module according to claim 9, wherein the fourth flexible circuit board further comprises the drive chip, and the drive chip is on a side, away from the touch sensor, of the main body of the fourth flexible circuit board.

11. The display module according to claim 8, further comprising a third flexible circuit board,
wherein the third flexible circuit board is on the side, away from the touch sensor, of the display substrate;
the first flexible circuit board and the third flexible circuit board are bonded, so as to allow the first flexible circuit board and the third flexible circuit board to be electrically connected with each other; and
the third flexible circuit board and the fourth flexible circuit board are bonded, so as to allow the third flexible circuit board and the fourth flexible circuit board to be electrically connected with each other.

12. The display module according to claim 11, wherein the main body of the first flexible circuit board is on a side, away from the display substrate, of the third flexible circuit board;
the first flexible circuit board further comprises an electrical connection region protruding from the main body, and the electrical connection region of the first flexible circuit board is on a side, away from the first bonding connection portion and the second bonding connection portion, of the main body of the first flexible circuit board;
the electrical connection region of the first flexible circuit board at least partially overlaps with the third flexible circuit board in a direction perpendicular to the display substrate; and
the first flexible circuit board is bonded with the third flexible circuit board through the electrical connection region so as to be electrically connected with third flexible circuit board.

13. The display module according to claim 1, further comprising a bonding support structure and a cover plate,
wherein the bonding support structure is respectively stacked with the first bonding connection portion and the second bonding connection portion in a direction perpendicular to the flat region of the display substrate;
the bonding support structure is on a side of a portion, which is in contact with the touch sensor, of the first bonding connection portion of the first flexible circuit board away from the touch sensor;
the cover plate is on the display side of the display substrate, and is on a side, away from the display substrate, of the touch sensor; and
the bonding support structure is sandwiched between the first flexible circuit board and the cover plate.

14. The display module according to claim 13, wherein the bonding support structure is a foam layer or a polyethylene terephthalate layer.

15. The display module according to claim 13, further comprising a polarizer, wherein the polarizer is between the touch sensor and the cover plate;
a sum of a thicknesses of the bonding support structure and a thicknesses the first bonding connection portion in a direction perpendicular to the flat region of the display substrate is substantially equal to a distance between the touch sensor and the cover plate in the direction perpendicular to the flat region of the display substrate.

16. The display module according to claim 15, further comprising an adhesive layer, wherein the adhesive layer is between the cover plate and the polarizer; and the sum of the thicknesses of the bonding support structure and the thicknesses of the first bonding connection portion in the direction perpendicular to the flat region of the display substrate is substantially equal to a sum of a thicknesses of the polarizer and a thicknesses of the adhesive layer in the direction perpendicular to the flat region of the display substrate.

17. A display device, comprising a display module, wherein the display module comprises a first flexible circuit board, a display substrate, and a touch sensor on a display side of the display substrate, the display substrate comprises a flat region and curved surface regions respectively on two sides of the flat region in a first direction;

the touch sensor comprises a first bonding region and a second bonding region on a first side of a second direction intersecting with the first direction;

the first bonding region and the second bonding region are on a surface, away from the display substrate, of the touch sensor, and the first bonding region and the second bonding region are stacked with the flat region and are spaced apart from each other;

the first flexible circuit board is electrically connected with the touch sensor through the first bonding region and the second bonding region;

the first flexible circuit board comprises a main body, and a first bonding connection portion and a second bonding connection portion which protrude from the main body and are spaced apart from each other; and the first bonding connection portion is extended to the first bonding region so as to be electrically connected with the first bonding region, and the second bonding connection portion is extended to the second bonding region so as to be electrically connected with the second bonding region;

the first bonding connection portion and the second bonding connection portion of the first flexible circuit board are bent, and the main body of the first flexible circuit board is on a side, away from the touch sensor, of the display substrate;

the display module further comprising: a drive chip on the side, away from the touch sensor, of the display substrate, wherein the drive chip is configured to drive the display substrate;

an orthographic projection of the drive chip on the flat region of the display substrate is in a region surrounded by an orthographic projection of the first bonding connection portion of the first flexible circuit board on the flat region of the display substrate, an orthographic projection of the second bonding connection portion of the first flexible circuit board on the flat region of the display substrate and an orthographic projection of the main body of the first flexible circuit board on the flat region of the display substrate; and the orthographic projection of the drive chip on the flat region of the display substrate is spaced apart from the orthographic projection of the first bonding connection portion of the first flexible circuit board on the flat region of the display substrate, the orthographic projection of the second bonding connection portion of the first flexible circuit board on the flat region of the display substrate and the orthographic projection of the main body of the first flexible circuit board on the flat region of the display substrate.

* * * * *

UNITED STATES PATENT AND TRADEMARK OFFICE
CERTIFICATE OF CORRECTION

PATENT NO. : 11,943,989 B2
APPLICATION NO. : 16/977642
DATED : March 26, 2024
INVENTOR(S) : Xiaoxia Huang It is certified that error appears in the above-identified patent and that said Letters Patent is hereby corrected as shown below:

In the Claims

Column 26, Claim 1, Line 24 should read:
region so as to be electrically

Signed and Sealed this
Twenty-third Day of July, 2024

Katherine Kelly Vidal
*Director of the United States Patent and Trademark Office*